United States Patent
Amarloo et al.

(10) Patent No.: US 10,605,840 B1
(45) Date of Patent: Mar. 31, 2020

(54) VAPOR CELLS HAVING REDUCED SCATTERING CROSS-SECTIONS AND THEIR METHODS OF MANUFACTURE

(71) Applicant: Quantum Valley Ideas Laboratories, Waterloo (CA)

(72) Inventors: Hadi Amarloo, Waterloo (CA); Jaime Ramirez-Serrano, Waterloo (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 16/659,284

(22) Filed: Oct. 21, 2019

(51) Int. Cl.
*G01R 29/08* (2006.01)
*G01J 5/08* (2006.01)
*C03C 27/06* (2006.01)
*G04F 5/14* (2006.01)

(52) U.S. Cl.
CPC .......... *G01R 29/0864* (2013.01); *C03C 27/06* (2013.01); *G01J 5/0875* (2013.01); *G01R 29/0885* (2013.01); *G04F 5/145* (2013.01)

(58) Field of Classification Search
CPC ............. G01R 29/0864; G01R 29/0885; G01J 5/0875; G04F 5/145; C03C 27/06
See application file for complete search history.

(56) References Cited

U.S. PATENT DOCUMENTS

| | | | |
|---|---|---|---|
| 8,906,470 | B2 | 12/2014 | Overstolz et al. |
| 10,509,065 | B1* | 12/2019 | Shaffer .............. G01R 29/0885 |
| 2005/0007118 | A1 | 1/2005 | Kitching et al. |
| 2016/0218726 | A1* | 7/2016 | Overstolz ................ H03L 7/26 |
| 2016/0363617 | A1* | 12/2016 | Anderson .......... G01R 29/0885 |
| 2019/0187198 | A1* | 6/2019 | Anderson .......... G01R 29/0878 |

OTHER PUBLICATIONS

Fan , et al., "Atom based RF electric field sensing", Journal of Physics B: Atomic, Molecular and Optical Physics, Sep. 9, 2015, 17 pgs.
Fan , et al., "Effect of Vapor-Cell Geometry on Rydberg-Atom-Based Measurements of Radio-Frequency Electric Fields", Physical Review Applied 4, 044015, 2015, 7 pgs.
Gosele , et al., "Wafer bonding for microsystems technologies", Sensors and Actuators 74, 161-168, 1999, 8 pgs.
Masteika , et al., "A Review of Hydrophilic Silicon Wafer Bonding", ECS Journal of Solid State Science and Technology, 3 (4) Q42-Q54, 2014, 13 pgs.
Sedlacek , et al., "Atom-Based Vector Microwave Electrometry Using Ribidium Rydberg Atoms in a Vapor Cell", Physical Review Letters, Aug. 6, 2013, 5 pgs.

(Continued)

*Primary Examiner* — Michael C Bryant
(74) *Attorney, Agent, or Firm* — Henry Patent Law Firm PLLC

(57) ABSTRACT

In a general aspect, a vapor cell is presented that includes a dielectric body. The dielectric body includes a surface that defines an opening to a cavity in the dielectric body and a plurality of holes between the cavity and a side of the dielectric body. The vapor cell also includes a vapor or a source of the vapor in the cavity of the dielectric body. An optical window covers the opening of the cavity and has a surface bonded to the surface of the dielectric body to form a seal around the opening. Methods of manufacturing vapor cells are also presented.

30 Claims, 8 Drawing Sheets

(56) References Cited

OTHER PUBLICATIONS

Sedlacek, et al., "Quantum Assisted Electrometry using Bright Atomic Resonances", arXiv:1205.4461v1 [physics.atom-ph], May 20, 2012, 15 pgs.
Suni, et al., "Effects of Plasma Activation on Hydrophilic Bonding of Si and SiO2", Journal of the Electrochemical Society, 149 (6) G348-G351, 2002, 4 pgs.

\* cited by examiner

VAPOR CELLS HAVING REDUCED SCATTERING CROSS-SECTIONS AND THEIR METHODS OF MANUFACTURE

BACKGROUND

The following description relates to vapor cells with reduced scattering cross-sections and their methods of manufacture.

Vapor cells are manufactured by sealing a vapor or gas within an enclosed volume. The vapor or gas is used as a medium to interact with electromagnetic radiation received by the vapor cells. Beams of light, such as generated by lasers, may be directed through the vapor or gas to probe and measure a response of the vapor or gas to the received electromagnetic radiation. In this way, the vapor cells may be used to determine properties of the received electromagnetic radiation and serve as sensors of electromagnetic radiation. However, such measurements may be negatively impacted by nonuniformities of the received electromagnetic radiation in the enclosed volume occupied by the vapor or gas. The measurements may also be negatively impacted by scattering of the received electromagnetic off walls or the body of the vapor cell. Vapor cells and methods of manufacture are desired that avoid or mitigate such negative phenomena.

DETAILED DESCRIPTION

Figure 1A:
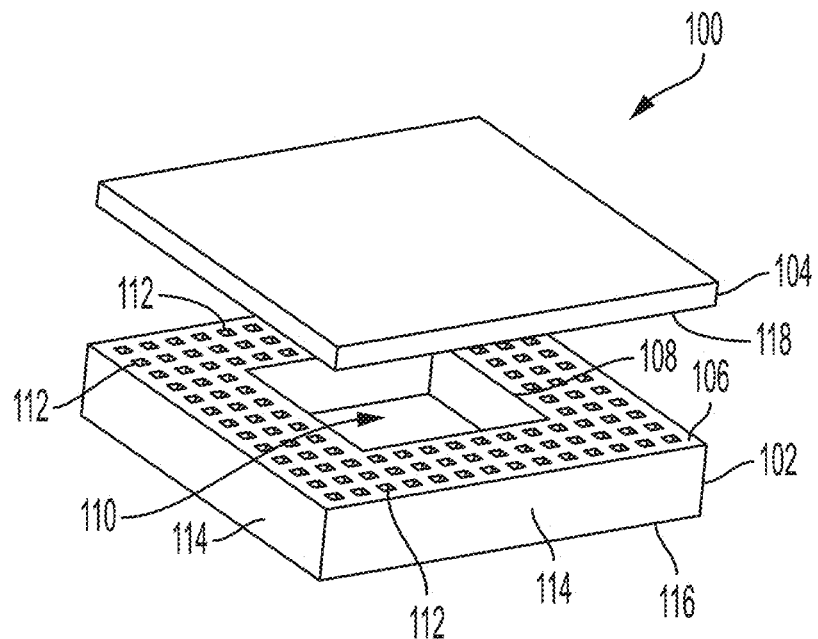
FIG. 1A is an exploded view, in perspective, of an example vapor cell having a dielectric body and an optical window.

In some aspects of what is described here, small, stemless vapor cells are presented that have improved electromagnetic transparency relative to conventional vapor cells. In addition, a uniformity of the electromagnetic field within the vapor cells is orders of magnitude better than that found in standard vapor cell geometries. The vapor cells incorporate the principles of metamaterials to reduce scattering cross-sections for a target electromagnetic radiation to be measured. This reduction can increase the field uniformity, and thus the accuracy of the measurement, while maintaining a structural strength required for the vapor cells. Rydberg atom-based electric field sensors based on such vapor cells have a wide range of possible applications, such as metrological applications. The vapor cells presented herein include sub-wavelength vapor cells that measure a uniform electric field in the region where vapor inside the vapor cells interacts with the test electric field for sensing. Such vapor cells and their uniform electric fields are capable of measuring frequencies over the MHz-THz range, which is important for over the air standards testing.

In some aspects of what is described here, methods of manufacturing are present that can manufacture a vapor cell for Rydberg atom-based electric field sensing. The vapor cell has a low scattering cross-section and a uniform electromagnetic field in the region of the vapor cell where the electromagnetic field is measured. The uniform electromagnetic field is robust to manufacturing variations of the vapor cell due to the accuracy of fabrication in relation to the target field wavelength(s) to be measured, and in many instances, due to the sub-wavelength dimension of the vapor cell. Furthermore, the methods of manufacturing are compatible with mass production. The methods are employed to fabricate vapor cells with metamaterial walls that create a more index-matched vapor cell. The methods may allow a pure alkali gas to be filled into the vapor cell. The methods may also allow vapor cells to be made entirely of glass, or alternatively, of silicon and glass. Other materials are possible. In the methods, laser and deep-reactive ion etching (DRIE) machining tools may be used to accurately form the metamaterial walls and holes therein so that small, sub-wavelength manufacturing variations, which are difficult to avoid, are much less than 1% of the target field wavelength (s) to be measured.

The decrease in the scattering of the electromagnetic waves and increase in the uniformity of the electromagnetic field in the measurement region of the vapor cell makes the vapor cells presented herein ideally suited for metrological measurements. Since the vapor cells are small compared to a wavelength of measured electromagnetic radiation, and furthermore is made entirely of dielectric materials, multiple vapor cells can be used in spatial proximity to one another to sense the electromagnetic field over a region of space. The vapor cells have an order of magnitude improvement in the field uniformity and scattering cross-section at electromagnetic frequencies up to 80 GHz when compared to vapor cells without metamaterial walls. The methods of manufacturing can also be used to fabricate vapor cells for higher electromagnetic frequencies.

The metamaterial walls include holes, cavities, and so forth to define shapes and patterns for the walls. The shapes and patterns may be chosen to make the vapor cells structurally sound, e.g., to maintain the high vacuum levels necessary for Rydberg atom-based electric field sensing. By shaping the walls using cavities rather than making them thin, the vapor cell can be made structurally sound. Using the methods, the resulting vapor cells can have longer operational lifetimes since their vacuum permeabilities are decreased relative to those with similar electromagnetic properties, but fabricated to have a reduced wall thickness. The vapor cells are also conducive for coating with anti-relaxation coatings, which are important for applications in magnetometry. Moreover, the vapor cells can be coupled optically over free space or through a waveguide such as an optical fiber. The vapor cell may even be encased in a thin layer of epoxy or parylene to increase its stability in some situations.

The use of Rydberg atoms for electrometry has already led to the most accurate, absolute measurements of high frequency electric fields (HFE) to date. This technology holds considerable promise for advancing the state-of-the-art in a number of antenna measurement applications. However, there are challenges at the extremes of antenna size (both small and large) as well at high power that can be mitigated by what is fundamentally a more electromagnetically transparent and conductor-free HFE probe than anything used at present. Beam-forming antennas at HFE are particularly difficult devices to focus and optimize. The use of a dielectric probe, such as the vapor cells described herein, can drive down the achievable error floor in these measurements while providing a means to drastically reduce costs. Such benefits open up new application spaces. Replacing antennas on satellites and unmanned aerial vehicles with self-calibrated sensors brings significant advantages, especially when considering that the overall detector package can be significantly more compact. By almost completely removing undesirable materials from the probe and tailoring its geometry to enhance desirable electromagnetic properties, new types of measurement can be enabled. One example is the measurement, in situ, of exceptionally large power densities in large-scale ground-based radar systems and air-based electronic warfare equipment, i.e., actively electronically scanned (AESA) radars. Probes that accurately reproduce the incident electromagnetic radiation field and have small scattering cross-sections are particularly important in the near-field regime and can be used to acquire multiple field points simultaneously.

Furthermore, millimeter waves can only be propagated relatively small distances, which presents a challenge for the design of 5G telecommunications equipment. The short propagation distance of millimeter waves (e.g., about 5-8 km maximum) will dramatically increase the number of cell towers and other equipment required for the implementation of 5G networks, escalating the maintenance costs. In contrast, current cell towers provide a range of about 35-70 km. Beamforming antennas are expected to play an important role in 5G networks and require service and testing. For backhaul systems, 5G nodes will need to be densely deployed throughout cities. Ease of service and testing, i.e. maintenance, of a dense network in an urban environment is a key challenge. Additionally, fragmented licensing and standards across the globe for millimeter wave technology could adversely affect 5G implementations. Over-the-air (OTA) testing is a key ingredient for the adoption of 5G technology and its support of the Internet of Things (IoT). Many of these issues also permeate the military test market as well.

To overcome free space path loss in millimeter wave communications, radar and sensing, antenna arrays are used to achieve higher directionality by forming a steerable beam that points to a target device. Beamforming antennas consist of an array of elements that are used to obtain a directional characteristic, so called multiple-input multiple-output MIMO antennas. The role of MIMO antennas for 5G New Radio (NR) technology makes OTA testing for the performance evaluation of radiation patterns essential. The antenna array calibration is critically important because of the strict requirement of antenna array beam steering along with that of sidelobe suppression. Precise phase and amplitude differences among antenna elements need to be calibrated and adjusted to maximize performance. Calibrations and optimization are further complicated by the fact that other system elements such as transceivers will be integrated into the antenna system. Many of the parameters affecting the calibration of the antenna system will change over time as they will be affected by factors such as weather and aging. Multiple field point measurements at the antenna need to be made in order to characterize a millimeter wave beam.

Testing of 5G networks will be radically different from present 4G (or LTE) networks, as it will expand beyond wireless device calibration, RF parametric testing, and functional testing. The industry will have to assure reliability of the network and within the devices. Military millimeter-wave devices must also meet rigorous testing requirements. In the United States, carriers are required to set industry standards regarding device performance. OTA testing will be critical for the evaluation of systems and components in both mobile and fixed location devices. Since some of this testing will be done in the field and during the research and development phase, an absolute, self-calibrated sensor and standard is important in order to make direct comparisons between tests in these very different environments. Because the transmission distances at millimeter wave frequencies decrease, it is necessary to accurately test under a wide range of conditions and effects, such as free space path loss, atmospheric absorption, scattering due to rain and particulates, line-of-sight obstructions, and so forth. 5G networks will service more than increased personal communications and entertainment. Calibration and standards regarding base stations will be critical because 5G networks will enable technology such as autonomous vehicles, drones, and industrial equipment that affect public safety. An absolute, self-calibrated sensor system will be a prerequisite for certification.

To enable a self-calibrated sensor, ideal for the applications in the area of metrological measurement, the probe needs to measure as uniform an electromagnetic field as possible in the sensing region, the effect of the vapor cell on the incident field must be known and the scattering cross-section of the probe must be as small as possible. It is also advantageous for vapors (e.g., gaseous atoms) in the vapor cell to have long coherence times. The long coherence times can be disrupted by collisions with a background gas when the atoms are in Rydberg states. Hence, pure alkali-metal vapor cells without buffer gases are important for such applications. For field testing, it is obvious that the probe must be structurally strong. The vapor cells disclosed herein can maintain their structural integrity while minimally perturbing the incident electromagnetic field. In addition, the vapor cells can measure the incident field accurately, be loaded with pure samples of atoms and molecules, and be precisely built en masse so their effect on the target field is well-known.

Figure 1B:
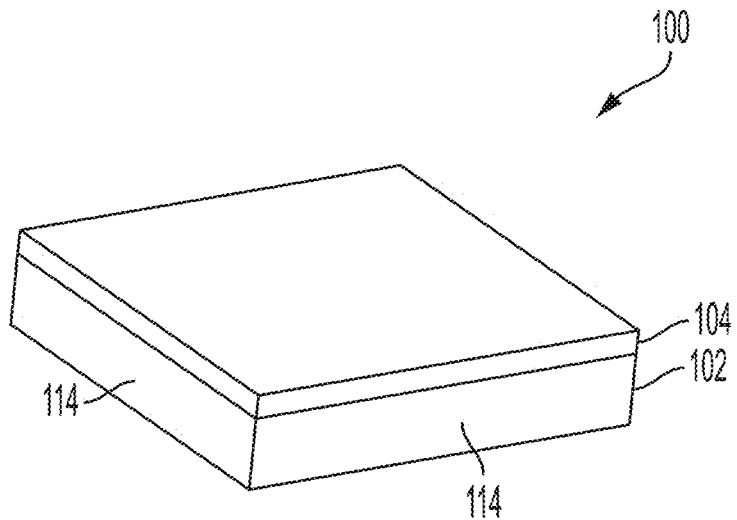
FIG. 1B is a perspective view of the example vapor cell 100 of FIG. 1A, but in which the optical window is bonded to the dielectric body.

Now referring to FIG. 1A, an exploded view is presented, in perspective, of an example vapor cell 100 having a dielectric body 102 and an optical window 104. FIG. 1B presents the example vapor cell 100 of FIG. 1A, but in which the optical window 104 is bonded to the dielectric body 102. The dielectric body 102 may be a substrate defined by opposing planar surfaces, as shown in FIGS. 1A-1B. However, other configurations are possible for the dielectric body 102. Moreover, although FIGS. 1A-1B depict the dielectric body 102 as being square-shaped, other shapes are possible. The optical window 104 may also be a substrate defined by opposing planar surfaces. However, other configurations are possible for the optical window 104. In general, the optical window 104 includes one surface adapted to mate (or bond)

against a surface of the dielectric body 102, thereby allowing a seal to form (e.g., via a contact bond).

The dielectric body 102 may be formed of a material highly transparent to electric fields (or electromagnetic radiation) measured by the vapor cell 100. The material may be an insulating material having a high resistivity, e.g., $\rho > 10^8$ $\Omega \cdot cm$, and may also correspond to a single crystal, a polycrystalline ceramic, or an amorphous glass. For example, the dielectric body 102 may be formed of silicon. In another example, the dielectric body 102 may be formed of a glass that includes silicon oxide (e.g., $SiO_2$, $SiO_x$, etc.), such as vitreous silica, a borosilicate glass, or an aluminosilicate glass. In some instances, the material of the dielectric body 102 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, etc.). In other instances, the material of the dielectric body 102 is a non-oxide material such as silicon (Si), diamond (C), gallium nitride (GaN), calcium fluoride (CaF), and so forth. In these instances, an adhesion layer may be disposed on the dielectric body 102 to define the surface 106 of the dielectric body 102. The adhesion layer may be capable of bonding to the non-oxide material of the dielectric body 102 while also being capable of forming a contact bond with the optical window 104. For example, the dielectric body 102 may be formed of silicon and the example vapor cell 100 may include an adhesion layer that includes silicon oxide (e.g., $SiO_2$, $SiO_x$, etc.) on the dielectric body 102. This adhesion layer defines the surface 106 of the dielectric body 102 and is capable of forming a contact bond that includes siloxane bonds.

The dielectric body 102 includes a surface 106 that defines an opening 108 to a cavity 110 in the dielectric body 102. The surface 106 may be a planar surface, as shown in FIGS. 1A-1B, although other surfaces are possible (e.g., curved). The opening 108 may be any type of opening that allows access to an internal volume of the cavity 110 and may have any shape (e.g., circular, square, hexagonal, oval, etc.). Such access may allow a vapor (or a source of the vapor) to be disposed into the cavity 110 during manufacture of the vapor cell 100. The cavity 110 extends from the surface 106 into the dielectric body 104 and stops before extending completely through the dielectric body 104. The cavity 110 may have a uniform cross-section along its extension through the dielectric body. However, in some variations, the cross-section of cavity 110 may vary along its extension.

The dielectric body 102 also includes a plurality of holes 112 between the cavity 110 and a side 114 of the dielectric body 102. The plurality of holes 112 may define an array of holes. The plurality of holes 112 may reduce a refractive index mismatch between the dielectric body 102 and an ambient environment thereof (e.g., air) when the example vapor cell 100 receives electromagnetic radiation. The plurality of holes 112 may also reduce a scattering cross-section of the example vapor cell 100 when receiving the electromagnetic radiation as well as increasing a uniformity of the electromagnetic radiation in the cavity 110. In some implementations, the example vapor cell 100 is configured to detect a target radiation, such as an electromagnetic radiation having a frequency ranging from 1 MHz to 1 THz. In such implementations, the plurality of holes 112 may have a largest dimension no greater than a wavelength of the target radiation, and the target radiation may have a wavelength of at least 0.3 mm.

In some implementations, the plurality of holes 112 encircles a perimeter defined by the opening 108 of the cavity 110. In these implementations, the opening 108 may define an inner perimeter and one or more sides 114 of the dielectric body 102 may define an outer perimeter. FIG. 1A depicts the plurality of holes 112 as having the same shape. However, in some variations, a portion (or all) of the holes 112 may have different shapes. For example, the plurality of holes 112 may include two or more subsets of holes, each having a different shape. In some implementations, the plurality of holes 112 includes a pattern of holes repeating around a perimeter. For example, if the plurality of holes 112 includes two or more subsets of holes, the two or more subsets of holes may be arranged relative to each other along the perimeter to define a pattern.

In some implementations, the plurality of holes 112 extends completely through the dielectric body 102. For example, the surface 106 of the dielectric body 102 may be a first surface, and the dielectric body 102 includes a second surface 116 opposite the first surface 106. The plurality of holes 112 may then extend from the first surface 106 to the second surface 116. However, in other implementations, a portion (or all) of the holes 112 extends only partially through the dielectric body 102. Such extension may start at the first surface 106 or the second surface 116 of the dielectric body 102. Although FIG. 1A depicts a constant cross-section for each of the plurality of holes 112, in some variations, one or more holes may vary in cross-section along an extension into the dielectric body 102. Moreover, the extension into the dielectric body 102 need not be perpendicular to the surface 106 or be straight. In some instances, the extension is angled relative to the surface 106. In some instances, the extension follows a curved pathway into the dielectric body 102.

The example vapor cell 100 includes a vapor (not shown) in the cavity 110 of the dielectric body 102. The vapor may include constituents such as a gas of alkali-metal atoms, a noble gas, a gas of diatomic halogen molecules, or a gas of organic molecules. For example, the vapor may include a gas of alkali-metal atoms (e.g., K, Rb, Cs, etc.), a noble gas (e.g., He, Ne, Ar, Kr, etc.), or both. In another example, the vapor may include a gas of diatomic halogen molecules (e.g., $F_2$, $Cl_2$, $Br_2$, etc.), a noble gas, or both. In yet another example, the vapor may include a gas of organic molecules (e.g., acetylene), a noble gas, or both. Other combinations for the vapor are possible, including other constituents.

The example vapor cell 100 may also include a source of the vapor in the cavity 110 of the dielectric body 102. The source of the vapor may generate the vapor in response to an energetic stimulus, such as heat, exposure to ultraviolet radiation, and so forth. For example, the vapor may correspond to a gas of alkali-metal atoms and the source of the vapor may correspond to an alkali-metal mass sufficiently cooled to be in a solid or liquid phase when disposed into the cavity 110. In some implementations, the source of the vapor resides in the cavity of the dielectric body, and the source of the vapor includes a liquid or solid source of the alkali-metal atoms configured to generate a gas of the alkali-metal atoms when heated.

The example vapor cell 100 additionally includes the optical window 104. As shown in FIG. 1B, the optical window 104 covers the opening 108 of the cavity 110 and has a surface 118 bonded to the surface 106 of the dielectric body 102. This bond forms a seal around the opening 108.

The surface 118 of the optical window 104 is configured to mate to the surface of the dielectric body 102 and may be planar surface. However, other types of surfaces are possible (e.g., curved). Examples of the bond between the two surfaces 106, 118 includes an anodic bond, a contact bond, and a fired glass-frit bond.

For example, a contact bond may form the seal around the opening 108. The seal may include metal-oxygen bonds formed by reacting a first plurality of hydroxyl ligands on the surface 106 of the dielectric body 102 with a second plurality of hydroxyl ligands on the surface 112 of the optical window 104. If one or both of the dielectric body 102 (or an adhesion layer thereon) and the optical window 104 include silicon oxide, the metal-oxide bonds may include siloxane bonds (i.e., Si—O—Si). However, other types of metal-oxygen bonds are possible, including hybrid oxo-metal bonds. For example, if the dielectric body 102 and the optical window are both formed of sapphire (e.g., $Al_2O_3$), the metal-oxygen bonds may include oxo-aluminum bonds (e.g., Al—O—Al). If the dielectric body 102 is formed of a glass that includes silicon oxide and the optical window 104 is formed of sapphire, the metal-oxygen bonds may include silicon-oxo-aluminum bonds (e.g., Si—O—Al, Al—O—Si, etc.).

The optical window 104 may be formed of a material highly transparent to electromagnetic radiation (e.g., laser light) used to probe the vapor sealed within the cavity 110 of the dielectric body 102. For example, the material of the optical window 104 may be transparent to infrared wavelengths of electromagnetic radiation (e.g., 700-1000 nm), visible wavelengths of electromagnetic radiation (e.g., 400-700 nm), or ultraviolet wavelengths of electromagnetic radiation (e.g., 200-400 nm). Moreover, the material of the optical window 104 may be an insulating material having a high resistivity, e.g., $\rho > 10^8$ $\Omega \cdot cm$, and may also correspond to a single crystal, a polycrystalline ceramic, or an amorphous glass. For example, the material of the optical window 104 may include silicon oxide (e.g., $SiO_2$, $SiO_x$, etc.), such as found within quartz, vitreous silica, or a borosilicate glass. In another example, the material of the optical window 104 may include aluminum oxide (e.g., $Al_2O_3$, $Al_xO_y$, etc.), such as found in sapphire or an aluminosilicate glass. In some instances, the material of the optical window 104 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, etc.). In other instances, the material of the dielectric body 102 is a non-oxide material such as diamond (C), calcium fluoride (CaF), and so forth.

In many implementations, the surface 106 of the dielectric body 102 and the surface 112 of the optical window 104 may have a surface roughness $R_a$, no greater than a threshold surface roughness. The threshold surface roughness may ensure that, during contact bonding, pathways are not formed that leak through the seal. Such pathways, if present, might allow contaminates to enter the cavity 110 and vapor to exit the vapor cell 100. In some variations, the threshold surface roughness is less than 50 nm. In some variations, the threshold surface roughness is less than 30 nm. In some variations, the threshold surface roughness is less than 10 nm. In some variations, the threshold surface roughness is less than 1 nm.

Figure 2A:
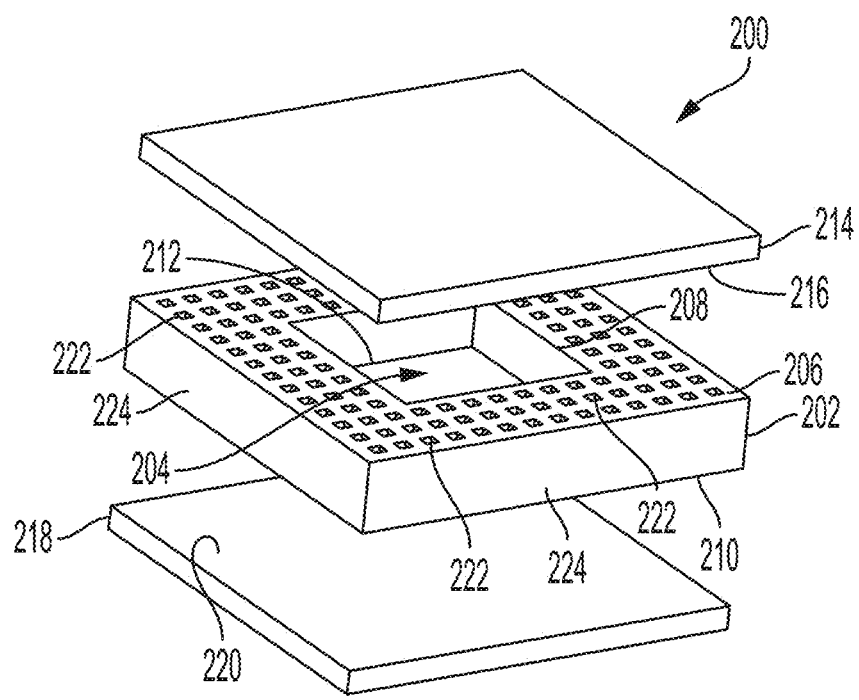
FIG. 2A is an exploded view, in perspective, of an example vapor cell having two optical windows.
Figure 2B:
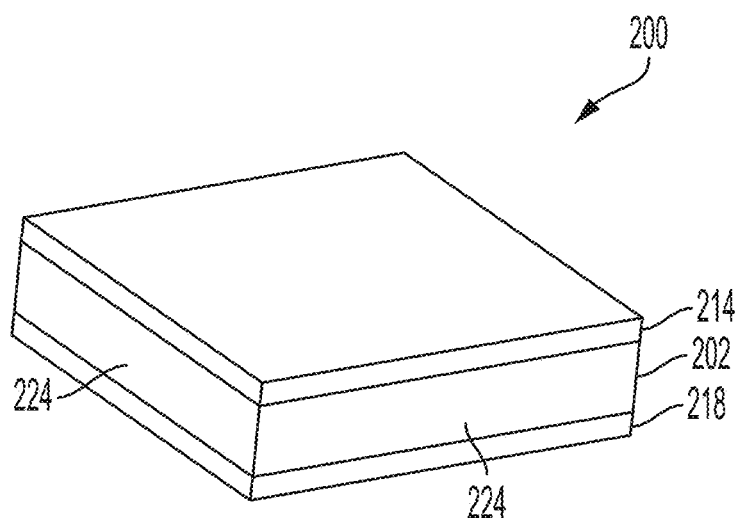
FIG. 2B is a perspective view of the example vapor cell of FIG. 2A, but in which both optical windows are bonded to a dielectric body of the example vapor cell.

Although FIGS. 1A and 1B depict the example vapor cell 100 as having a single optical window, two or more optical windows are possible for the example vapor cell 100. Moreover, in some variations, the cavity 110 may extend entirely through dielectric body 102. FIG. 2A presents an exploded view, in perspective, of an example vapor cell 200 having two optical windows. The example vapor cell 200 may be analogous in many features to the example vapor cell 100 shown by FIGS. 1A-1B. FIG. 2B presents the example vapor cell 200 of FIG. 2A, but in which both optical windows are bonded to a dielectric body 202 of the example vapor cell 200. The example vapor cell 200 includes a dielectric body 202 and a cavity 204 in the dielectric body 202. The cavity 204 extends completely through the dielectric body 202. A first surface 206 of the dielectric body 202 defines a first opening 208 to the cavity 204, and a second surface 210 of the dielectric body 202 defines a second opening 212 to the cavity 204. The second surface 210 may be opposite the first surface 206, and in some instances, one or both of the first and second surfaces 206, 210 are planar surfaces. A vapor or a source of the vapor resides in the cavity 204 of the dielectric body 202.

The example vapor cell 200 also includes a first optical window 214 covering the first opening 208 of the cavity 204. The first optical window 214 has a surface 216 bonded to the first surface 206 of the dielectric body 202 to form a first seal around the first opening 208. The example vapor cell 200 additionally includes a second optical window 218 covering the second opening 212 of the cavity 204. The second optical window 218 has a surface 220 bonded to the second surface 210 of the dielectric body 202 to form a second seal around the second opening 212. In some instances, one or both of the two surfaces 216, 220 are planar surfaces. Such planar configuration may allow one or both of the two surfaces 216, 220 to mate to, respectively, the first and second surfaces 206, 210 of the dielectric body 202. For example, the second surface 210 of the dielectric body 202 and the surface 220 of the second optical window 218 may be planar surfaces.

The dielectric body 202 and the optical windows 214, 218 may share features in common with, respectively, the dielectric body 102 and the optical window 104 described in relation to the example vapor cell 100 of FIGS. 1A-1B. For example, the dielectric body 202 may be formed of silicon (Si), aluminum oxide (e.g., $Al_2O_3$), or a glass that includes silicon oxide (e.g., $SiO_2$, $SiO_x$, etc.). In another example, one or both of first and second optical windows 214, 218 may be formed of a material transparent to electromagnetic radiation (e.g., laser light) used to probe the vapor sealed within the cavity 204 of the dielectric body 202. Other features and combinations are possible. Similarly, the vapor and the source of the vapor may share features in common with, respectively, the vapor and the source of the vapor described in relation to the example vapor cell 100 of FIGS. 1A-1B. For example, the vapor may include a gas of alkali-metal atoms, a noble gas, a gas of diatomic halogen molecules, a gas of organic molecules, or some combination thereof. In another example, the source of the vapor may reside in the cavity 204 of the dielectric body 202, and the source of the vapor may include a liquid or a solid source of alkali-metal atoms configured to generate a gas of the alkali-metal atoms when heated. Other features and combinations are possible.

Similar to the example vapor cell 100 of FIGS. 1A-1B, the dielectric body 202 of the example vapor cell 200 includes a plurality of holes 222 between the cavity 204 and a side 224 of the dielectric body 202. The plurality of holes 222 may define an array of holes, and may extend into the dielectric body 202 from one or both of two opposing surfaces of the dielectric body 202. In some variations, the plurality of holes 222 extend through dielectric body 202, while in other variations, the plurality of holes 222 extend only partially into the dielectric body 202. The plurality of holes 222 may reduce a refractive index mismatch between the dielectric body 202 and an ambient environment thereof (e.g., air) when the example vapor cell 200 receives electromagnetic radiation. The plurality of holes 222 may also reduce a scattering cross-section of the example vapor cell 200 when receiving the electromagnetic radiation as well as increasing a uniformity of the electromagnetic radiation in the cavity 204. In some implementations, the example vapor cell 200 is configured to detect a target radiation, such as an electromagnetic radiation having a frequency ranging from 1 MHz to 1 THz. In such implementations, the plurality of holes 222 may have a largest dimension no greater than a wavelength of the target radiation, and the target radiation may have a wavelength of at least 0.3 mm.

In some implementations, the plurality of holes 222 encircles a perimeter defined by the first and second openings 208, 212 of the cavity 204. In these implementations, the first and second openings 208, 212 may define respective first and second inner perimeters and one or more sides 224 of the dielectric body 202 may define an outer perimeter. FIG. 1A depicts the plurality of holes 222 as having the same shape. However, in some variations, a portion (or all) of the holes 222 may have different shapes. For example, the plurality of holes 222 may include two or more subsets of holes, each having a different shape. In some implementations, the plurality of holes 222 includes a pattern of holes repeating around a perimeter. For example, if the plurality of holes 222 includes two or more subsets of holes, the two or more subsets of holes may be arranged relative to each other along the perimeter to define a pattern.

In some implementations, the plurality of holes 222 extends completely through the dielectric body 202. For example, the plurality of holes 222 may extend from the first surface 106 to the second surface 116. However, in other implementations, a portion (or all) of the holes 222 extends only partially through the dielectric substrate 102. Such extension may start at the first surface 206 or the second surface 216 of the dielectric body 202. For example, the plurality of holes 222 may be a first plurality of holes extending from the first surface 206 into the dielectric body 202. The first plurality of holes may be between the first opening 208 of the cavity 204 and the side 224 of the dielectric body 202. The dielectric body 202 may then include a second plurality of holes extending from the second surface 210 into the dielectric body 202. The second plurality of holes may be between the second opening 212 of the cavity 204 and the side of the dielectric body 202. In some instances, the second plurality of holes encircles a second perimeter defined by the second opening 212 of the cavity 204. The second plurality of holes may include a pattern of holes repeating around the second perimeter.

Although FIG. 2A depicts a constant cross-section for each of the plurality of holes 222, in some variations, one or more holes may vary in cross-section along an extension into the dielectric body 202. Moreover, the extension into the dielectric body 202 need not be perpendicular to the first and second surfaces 206, 210 or be straight. In some instances, the extension is angled relative to the first and second surfaces 206, 210. In some instances, the extension follows a curved pathway into the dielectric body 202.

In implementations where the dielectric body 202 is formed of a non-oxide material, an adhesion layer may be disposed on the dielectric body 202 to define the first surface 206 of the dielectric body 202. The adhesion layer may be capable of bonding to the non-oxide material of the dielectric body 202 while also being capable of forming a contact bond with the surface 216 of the first optical window 214. For example, the dielectric body 202 may be formed of silicon and the example vapor cell 200 may include an adhesion layer that includes silicon oxide (e.g., $SiO_2$, $SiO_x$, etc.) on the dielectric body 202. This adhesion layer defines the first surface 206 of the dielectric body 202 and is capable of forming a contact bond that includes siloxane bonds. In some implementations, the second seal comprises metal-oxygen bonds formed by reacting a third plurality of hydroxyl ligands on the second surface 210 of the dielectric body 202 with a fourth plurality of hydroxyl ligands on the surface 220 of the second optical window 218. In these implementations, example vapor cell 200 may include an adhesion layer disposed on the dielectric body 202 to define the second surface 210 of the dielectric body 202 if the dielectric body is formed of a non-oxide material.

In some implementations, such as shown in FIGS. 2A-2B, the first and second surfaces 206, 210 of the dielectric body 202 are planar surfaces opposite each other, and the surface 216 of the first optical window 214 and the surface 220 of the second optical window 218 are planar surfaces. In some implementations, the second surface 210 of the dielectric body 202 and the surface 220 of the second optical window 218 have a surface roughness, $R_a$, no greater than a threshold surface roughness. In some variations, the threshold surface roughness is less than 50 nm. In some variations, the threshold surface roughness is less than 30 nm. In some variations, the threshold surface roughness is less than 10 nm. In some variations, the threshold surface roughness is less than 1 nm. In further implementations, the threshold surface roughness is a second threshold surface roughness, and the first surface 206 of the dielectric body 202 and surface 216 of the first optical window 214 have a surface roughness, $R_a$, no greater than a first threshold surface roughness. The first threshold surface roughness need not be the same as the second threshold surface roughness.

In some implementations, the second seal includes an anodic bond between the second surface 210 of the dielectric body 202 and the surface 220 of the second optical window 218. For example, the dielectric body 202 may be formed of silicon and the second optical window 218 may include silicon oxide (e.g., $SiO_2$, $SiO_x$, etc.). The second seal may then include an anodic bond between the second surface 210 of the dielectric body 202 and the surface 220 of the second optical window 218. In another example, the dielectric body 202 may be formed of a glass comprising silicon oxide (e.g., $SiO_2$, $SiO_x$, etc.) and the second optical window 218 may include silicon oxide (e.g., $SiO_2$, $SiO_x$, etc.). In this example, the vapor cell 200 may include a layer of silicon disposed between the second surface 210 of the dielectric body 202 and the surface 220 of the second optical window 218. The second seal includes an anodic bond between the layer of silicon and one or both of the second surface 210 of the dielectric body 202 and the surface 220 of the second optical window 218.

In some implementations, the dielectric body 202 is formed of a glass comprising silicon oxide (e.g., $SiO_2$, $SiO_x$, etc.) and the second optical window 218 includes silicon oxide (e.g., $SiO_2$, $SiO_x$, etc.). In such cases, the example vapor cell 200 includes a fired layer of glass frit bonding the second surface 210 of the dielectric body 202 to the surface 220 of the second optical window 218. The fired layer of glass frit defines the second seal.

The example vapor cells 100, 200 described in relation to FIGS. 1A-2b may correspond to vapor cells for Rydberg atom-based electric field sensing. Such vapor cells have a low scattering cross-section and uniform electromagnetic field in the region of the vapor cell (e.g., the cavities 110, 204) where the electromagnetic field is measured. As such, the measured electromagnetic field may be immune to manufacturing variations in one or more aspects of the vapor cell (e.g., a width of a side wall). The vapor cells use metamaterial walls that are defined by holes, voids, and so forth to create a more index-matched vapor cell that is structurally sound. Two examples are presented where a pure alkali gas is filled into the vapor cell—one vapor cell is made entirely of glass while the other is made of silicon and glass.

The vapor cells may be constructed from at least one optical window (e.g., 1-2 optical windows) and a dielectric body that serves as a frame. The frame include a single cavity or array of cavities machined in the dielectric body to make a chip that can be subsequently cut (e.g., with a dicing saw, a laser, etc.) into individual vapor cells at a later date. As described above in relation to the example vapor cells 100, 200, the frame (or dielectric body) can be formed of various materials such as glass or silicon. Such materials can be machined with a laser, and a dielectric body formed of silicon, may also be machined using deep reactive ion etching (DRIE).

The at least one optical window can be made out of thin glass so that light of a desired wavelength can pass into the cavity. Such passage allows the light to interact with a vapor (e.g., gaseous atoms or molecules) contained in the vapor cell. The at least one optical window can be antireflection coated or coated to transmit one or more specific colors of light. The at least one optical window may have a thermal expansion coefficient that matches (or closely matches) that of the frame. For example, if the frame is formed of silicon, the at least one optical window may be formed of a borosilicate glass (e.g., a MEMpax wafer from Schott). If the frame is not closed on one of its surfaces (e.g., the surface 210 of dielectric body 202, etc.), then the frame may be bonded to an optical window or a plate that will serve as an entry or exit optic for the vapor cell.

Bonding can be accomplished with a technique such as anodic or glass frit bonding, which is done at high voltages and/or temperatures since the frame is open and can outgas during the process. Such bonds are capable of forming leak-tight seals for high vacuum operation. Once this bond is complete, the frame can be contact bonded to the remaining window or plate in an atmosphere of the vapor or gas that will fill the vapor cell. The frame is machined with small subwavelength holes to better index match the frame's structure to its environment (e.g., air, free space, etc.). This machining can be done via DRIE etching (e.g., for silicon) or via laser machining with a pulsed laser to avoid melting the sample (e.g., for glass or silicon).

Figure 3:
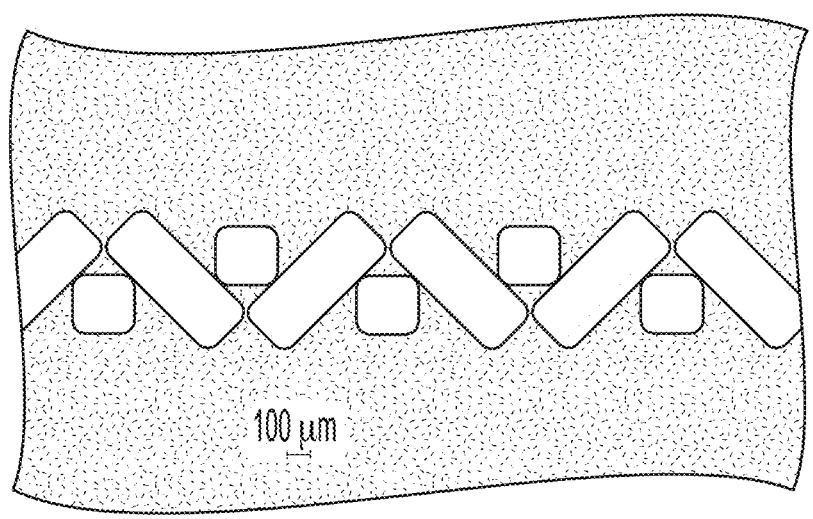
FIG. 3 is a schematic diagram of an example plurality of holes defining a metamaterial wall in a dielectric body of a vapor cell.

FIG. 3 shows a possible wall pattern that may be manufactured into a frame or dielectric body using a plurality of holes or voids. The wall pattern has the structural integrity to support the necessary vacuum pressure within the cavity. However, other patterns are possible. In many implementations, the structures defined by the plurality of holes are voids having sub-wavelength dimensions for a target electromagnetic radiation that is to be measured by the vapor cell. Moreover, the structures maintain the mechanical integrity of the vapor cell with regards to a vacuum-tight seal and handling during manufacturing and deployment. The vapor cell may be optically coupled over free space or through a waveguide such as an optical fiber. In some implementations, the plurality of holes or voids may be larger than a wavelength of the target electromagnetic radiation if scattering of the incident radiation and interference are used to either enhance or eliminate the electromagnetic field. Multiple vapor cells may be connected together to form arrays since their scattering cross-sections are small relative to their geometric cross-sections. As such, the vapor cell sensors interfere minimally with each other, if at all.

In some implementations, the vapor cell consists of two optical windows affixed to a frame (e.g., the vapor cell 200 of FIGS. 2A-2B). The optical windows or the frame may have additional coatings on their respective surfaces to tailor the vapor cell for optical transmission, optical reflection, and adhesion of the optical windows to the frame. The vapor cell may be constructed by first laser machining (or by some other type of microstructuring such as etching) a cavity and metamaterial walls of the vapor cell. The surfaces are then prepared so that the optical windows can be bonded to the frame. A first optical window is affixed to the frame using a method such as glass frit bonding or anodic bonding. This bonding operation can be done at high temperatures and/or voltages. After completion of the bonding operation, the remaining exposed surfaces are prepared for contact bonding, e.g., the first surface 206 of the dielectric body 202 and the surface 216 of the first optical window 214. Contact bonding is then carried out in an atmosphere of the vapor or gas to be filled into the vapor cell. The contact bonding operation is done at low temperatures (e.g., less than 250° C.) and zero voltage to prevent outgassing of undesirable gasses into the vapor cell's cavity.

Gasses produced in the contact bonding operation, such as water vapor, can be reacted to form products that are solid at room temperature. For example, if the vapor in the cavity is a gas of cesium atoms, water vapor produced during the contact bonding operation will react with a portion of the cesium atoms to the form solids, such as $Cs_2O$ ($T_{melt} \cong 340°$ C.), CsOH ($T_{melt} \cong 272°$ C.), or CsH ($T_{melt} \cong 170°$ C.). The vapor cell can be coated with epoxy and parylene if there is a desire to protect the vapor cell further. The vapor cell can also be coupled to a waveguide or be used in a free-space application. In some variations, the vapor cell is annealed to strengthen the bond (e.g., at a temperature less than 250° C.).

Multiple vapor cells can be connected together or arranged in an array to make multiple simultaneous measurements in a region of space. For example, multiple vapor cells can be arranged in a planar array so that an electromagnetic field can be characterized in a plane of the array. Three-dimensional arrays are also possible. Such capabilities may be allowed by the dielectric nature of the vapor cells (e.g., their dielectric bodies) since the vapor cells minimally interact with each other due to low scattering cross-sections. Light to probe the vapor in the vapor cells can be transported through optical waveguides, such as fiber, in parallel or series, but have to be readout independently (the signal light has to be split off at each vapor cell to give a measurement that reflects the absorption or dispersive signal associated with the individual vapor cell). In essence, this is a multipixel array, but the transparent nature of vapor cells makes 3-dimensional imaging possible. Thick cells can be manufactured by this method by stacking unit cells together or to make unique shapes, such as taking anodically bonded glass+frames (laser cut together), stacking them and anodically bonding several together one at a time, and then capping the structure with a contact bond.

Figure 4:
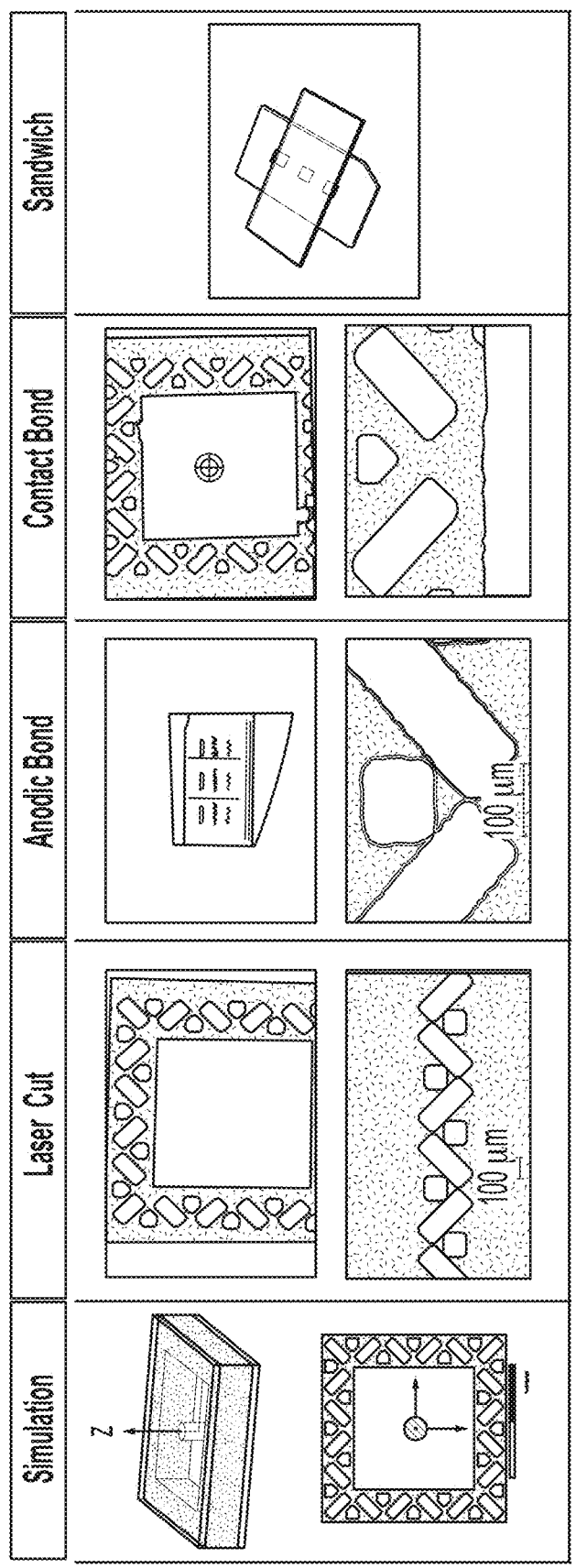
FIG. 4 is a schematic diagram is of an example method of manufacturing chips that include one or more vapor cells.

Now referring to FIG. 4, a schematic diagram is presented of an example method of manufacturing chips that include one or more vapor cells. Each vapor cell includes a plurality of holes defining a pattern. The pattern reduces the index of refraction or impedance matching of a vapor cell relative to an incident wave of target radiation to be measured. FIG. 4 depicts the chips as having three or six vapor cells. However, other numbers of vapor cells are possible. The method of manufacturing may start after a simulation phase is used to design a metamaterial wall for the one or more vapor cells. In particular, the simulation may allow those skilled in the art to design a pattern for the plurality of holes. The method of manufacturing includes removing material from a chip to define cavities for each vapor cell and a respective plurality of holes. An anodic bond may then be formed between an optical window and the chip, followed by a contact bond between another optical window and the chip. The chip may then be disposed between the two optical windows in a sandwiched configuration.

Figure 5:
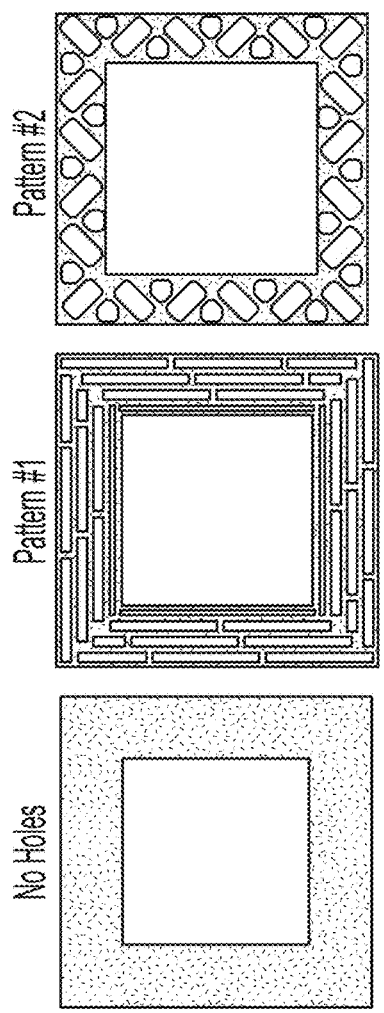
FIG. 5 is a comparison of scattering cross-sections for three example vapor cells, one having a solid wall and two having respective metamaterial walls.
Figure 5:
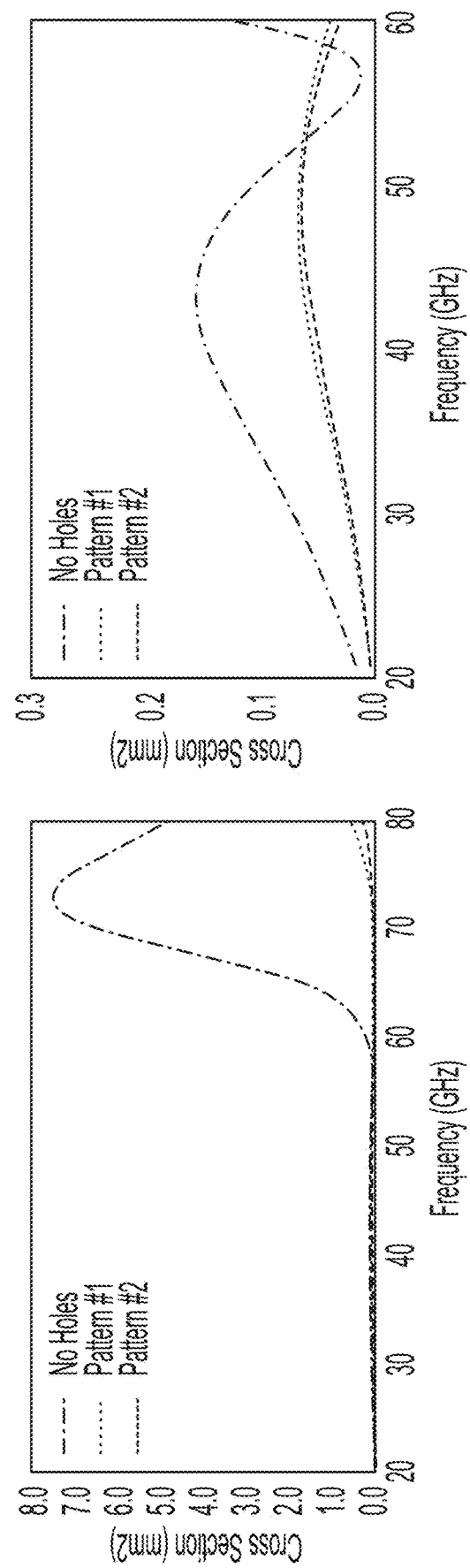

Now referring to FIG. 5, a comparison is presented of scattering cross-sections for three example vapor cells, one having a solid wall and two having respective metamaterial walls. Modeled values of the scattering cross sections (RCS) are presented in a lower left graph for frequencies of electromagnetic radiation ranging from 20 GHz to 80 GHz. A lower right graph presents the frequencies of electromagnetic radiation from the lower left graph, but within a narrower range from 20 GHz to 60 GHz. The two example vapor cells with metamaterial walls each have a different pattern of holes disposed around a square cavity. The example vapor cells all have frames (or dielectric bodies) with square cross-sections. An edge length of the square cross-sections is 1.5 mm, and a height of the example vapor cells is 0.5 mm. The scattering cross-sections are notably reduced for the two example vapor cells with metamaterial walls relative to the single example vapor cell with the solid wall. In particular, the RCS values are lower for the two example vapor cells with metamaterial walls over a range from about 20 GHz to 53 GHz (see lower right graph) and a range from about 60 GHz to 80 GHz (see lower left graph).

Figure 6:
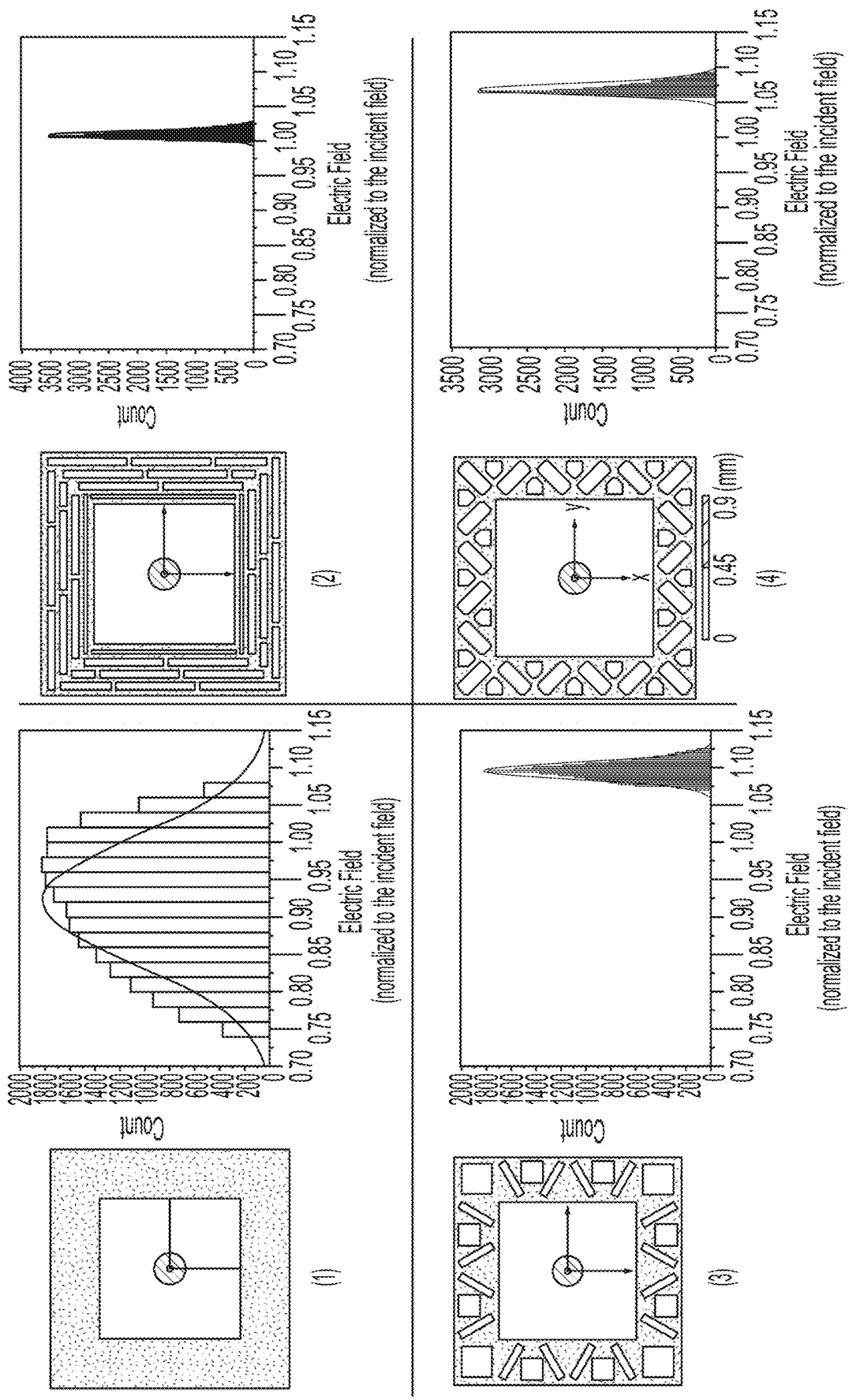
FIG. 6 is a comparison of an electric field distribution in four square vapor cells, each having a different pattern of holes to define a respective metamaterial wall.

Now referring to FIG. 6, simulated graphs of electric field distribution are presented for four example square vapor cells, each of which has a different pattern of holes to define a respective metamaterial wall. The simulated graphs were generated by modeling an 80 GHz plane wave of unit amplitude incident on the example vapor cells. Each vapor cell was sampled across a central circular region in its respective cavity. The central circular region corresponds to the region where the laser beams may be used to initialize and measure a response of atoms or molecules (e.g., the sealed vapor) to electromagnetic radiation passing through a vapor cell. The distribution of measured electric fields is a much narrower when the vapor cell is better index-matched to free space. The patterns of holes illustrated in FIG. 6 illustrate that virtually any two-dimensional shape can be machined in the frame to define the metamaterial wall, especially if laser cutting is used.

Figure 7:
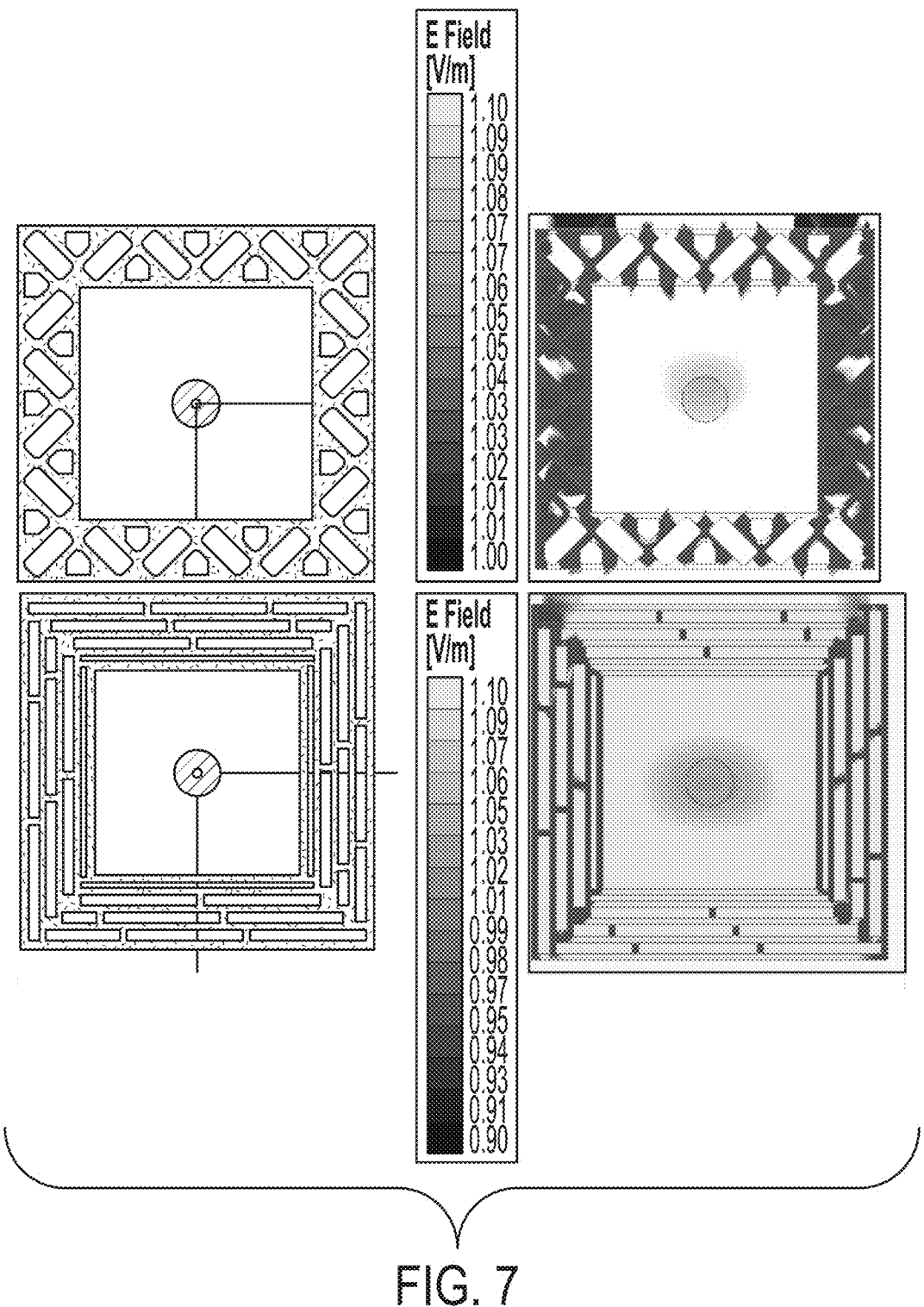
FIG. 7 is a simulated contour plot is presented of an electric field distribution in two example vapor cells having metamaterial walls.

Now referring to FIG. 7, a simulated contour plot is presented of an electric field distribution in two example vapor cells having metamaterial walls. A geometric cross-section of each example vapor cell is disposed adjacent and to the left of its corresponding simulated contour plot. The circular region in the center of each example vapor cell is the region probed by one or more laser beams to characterize electromagnetic radiation incident on a respective vapor cell. The electric field distributions are represented by grey-scale intensities that correspond to an electric field strength in V/m. The electric field distributions are uniform and occur within a range from 1.00 V/m to 1.10 V/m for the example vapor cell associated with the upper portion of FIG. 7 and a range from 0.9 V/m to 1.10 V/m for the example vapor cell associated with the lower portion of FIG. 7.

Figure 8:
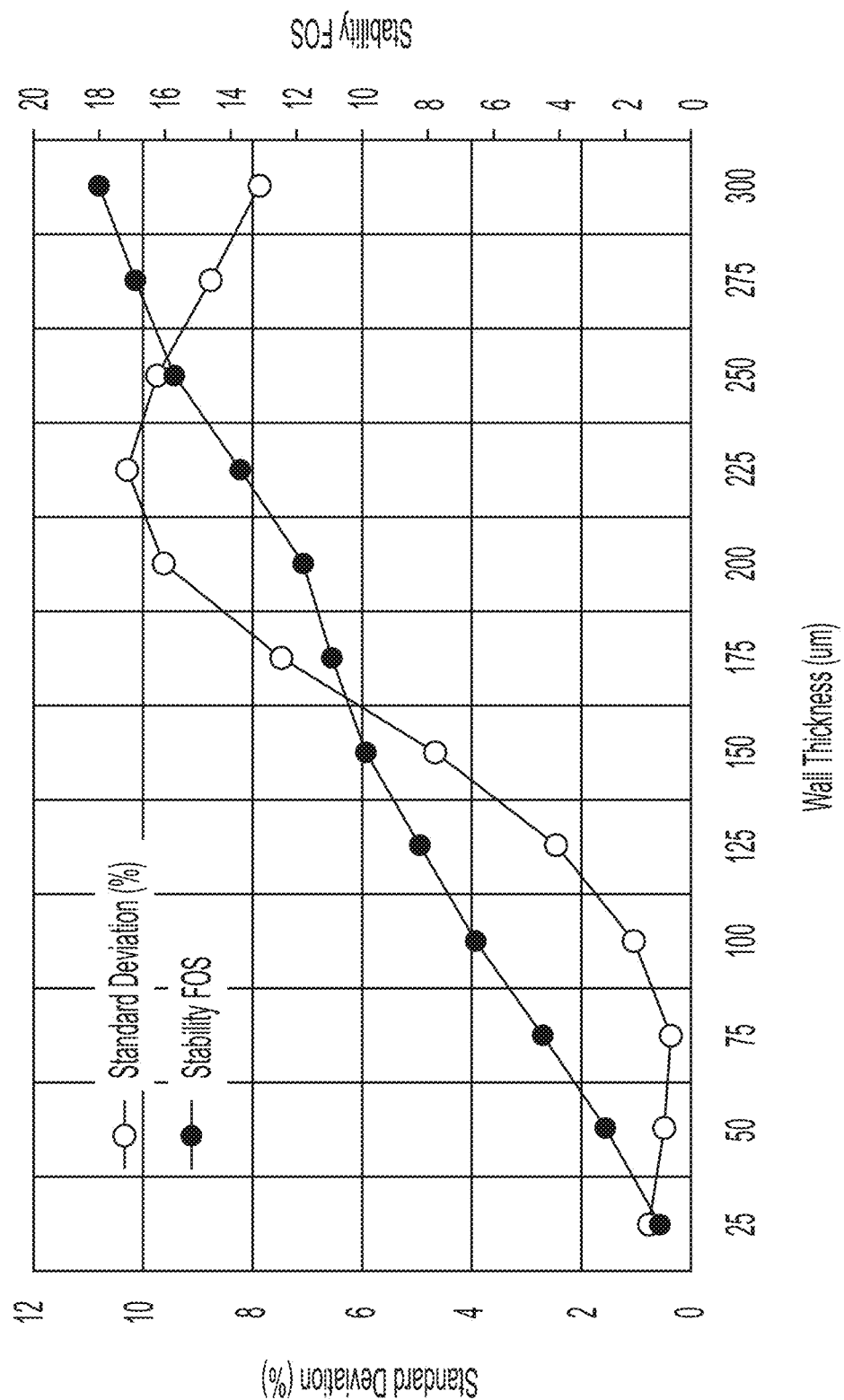
FIG. 8 is a graph showing a standard deviation of a measured electric field in a vapor cell and a structural stability of the vapor cell as a function of wall thickness.

Now referring to FIG. 8, a graph is presented showing a standard deviation of a measured electric field in a vapor cell and the structural stability of the vapor cell as a function of wall thickness. The vapor cell is a square vapor cell with no holes present in a frame (or wall). To achieve a standard deviation of the measured electric field of less than about 1%, the wall thickness is about 80 μm. The factor of safety (FoS) for a vapor cell with 80-μm walls is 4.7. In contrast, the equivalent metrology vapor cell has a factor of safety of about 34 for an equivalent field standard deviation. FIG. 8 shows that the vapor cell (or metrology vapor cell) has both structural stability and a high uniform electric field in comparison to a conventional vapor cell.

In some implementations, a method of manufacturing a vapor cell includes obtaining a dielectric body. The dielectric body includes a surface that defines an opening to a cavity in the dielectric body, and a plurality of holes between the cavity and a side of the dielectric body. The method also includes obtaining an optical window having a surface. The surface of the dielectric body and the surface of the optical window may be planar surfaces. A vapor or a source of the vapor is disposed into the cavity. The method additionally includes bonding the surface of the optical window to the surface of the dielectric body to form a seal around the opening to the cavity. In some implementations, bonding the surface includes covering the opening of the cavity with the optical window to enclose the vapor or the source of the vapor in the cavity.

In some implementations, disposing the vapor of the source of the vapor includes exposing the cavity to a vacuum environment that includes a gas of alkali-metal atoms. However, other types of vacuum environments are possible (e.g., those that include a gas of diatomic halogen molecules). In some implementations, obtaining the dielectric body includes removing material from the dielectric body to form the cavity, the plurality of holes, or both. Removing material may include machining material from the surface of the dielectric body with a laser. Removing material may also include etching material from the surface of the dielectric body. Such etching may involve one or both of a dry or wet etching process. Other types of subtractive processes are possible for the operation of removing material (e.g., ablation, grinding, polishing, etc.).

In some implementations, the plurality of holes encircles a perimeter defined by the opening of the cavity. The plurality of holes may include a pattern of holes repeating around the perimeter. In some implementations, the surface of the dielectric body is a first surface and the dielectric body includes a second surface opposite the first surface. In these implementations, the plurality of holes extends from the first surface to the second surface. In some implementations, the vapor cell, when manufactured, is configured to detect a target radiation (e.g., an electromagnetic radiation having a frequency ranging from 1 MHz to 1 THz). Each of the plurality of holes has a largest dimension no greater than a wavelength of the target radiation. In some instances, the target radiation has a wavelength of at least 3 mm.

In some variations, the dielectric body may be formed of silicon. In such variations, the method may include forming an adhesion layer on the dielectric body that defines the surface of the dielectric body. The adhesion layer may include silicon oxide (e.g., $SiO_2$, $SiO_x$, etc.). In some variations, the dielectric body is formed of a glass that includes silicon oxide (e.g., $SiO_2$, $SiO_x$, etc.). In some variations, the optical window includes silicon oxide (e.g., $SiO_2$, $SiO_x$, etc.).

In some implementations, the method includes altering the surface of the dielectric body and the surface of the optical window to include respectively, a first plurality of hydroxyl ligands and a second plurality of hydroxyl ligands. In these implementations, bonding the surfaces includes contacting the altered surface of the dielectric body to the altered surface of the optical window to form the seal around the opening of the cavity. The seal includes metal-oxygen bonds formed by reacting the first plurality of hydroxyl ligands with the second plurality of hydroxyl ligands during contact of the altered surfaces. In some instances, altering the surfaces includes activating one or both of the surfaces of the dielectric body and the optical window by exposing the respective surfaces to a plasma. Altering the surfaces may also include washing one or both of the activated surfaces of the dielectric body and the optical window in a basic aqueous solution.

The method may also be used to manufacture vapor cells having at least two optical windows. In some implementations, the surface is a first surface, the opening is a first opening, the optical window is a first optical window, and the seal is a first seal. Moreover, the dielectric body includes a second surface that defines a second opening to the cavity of the dielectric body. The first and second surfaces of the dielectric body may be opposite each other. In these implementations, the method includes obtaining a second optical window having a surface, and bonding the surface of the second optical window to the second surface of the dielectric body to form a second seal around the second opening of the cavity. The second surface of the dielectric body and the surface of the second optical window may be planar surfaces.

In some variations, the plurality of holes is a first plurality of holes extending from the first surface into the dielectric body, and the dielectric body includes a second plurality of holes extending from the second surface into the dielectric body. The first plurality of holes is between the first opening of the cavity and the side of the dielectric body, and the second plurality of holes is between the second opening of the cavity and the side of the dielectric body. The second plurality of holes may encircle a second perimeter defined by the second opening of the cavity. The second plurality of holes may include a pattern of holes repeating around the second perimeter.

In some implementations, the dielectric body is formed of silicon and the second optical window includes silicon oxide (e.g., $SiO_2$, $SiO_x$, etc.). In these implementations, bonding the surface of the second optical window includes anodically bonding the surface of the second optical window to the second surface of the dielectric body to form the second seal. In other implementations, the dielectric body is formed of a glass that includes silicon oxide (e.g., $SiO_2$, $SiO_x$, etc.) and the second optical window includes silicon oxide (e.g., $SiO_2$, $SiO_x$, etc.). The method then includes depositing a layer of silicon on the second surface of the dielectric body. Moreover, bonding the surface of the second optical window includes anodically bonding the layer of silicon to the surface of the second optical window to form the second seal.

In some implementations, the dielectric body is formed of a glass that includes silicon oxide (e.g., $SiO_2$, $SiO_x$, etc.) and the second optical window includes silicon oxide (e.g., $SiO_2$, $SiO_x$, etc.). In such implementations, bonding the surface of the second optical window includes applying a glass frit to one or both of the second surface of the dielectric body and the surface of the second optical window, and contacting the second surface of the dielectric body to the surface of the second optical window. At least one of the glass frit, the dielectric body, or the second optical window is then heated to a firing temperature to form the second seal.

In some implementations, the method includes altering the second surface of the dielectric body and the surface of the second optical window to include, respectively, a third plurality of hydroxyl ligands and a fourth plurality of hydroxyl ligands. In these implementations, bonding the surfaces includes contacting the altered second surface of the dielectric body to the altered surface of the second optical window to form the second seal around the second opening of the cavity. The second seal includes metal-oxygen bonds formed by reacting the third plurality of hydroxyl ligands with the fourth plurality of hydroxyl ligands during contact of the altered surfaces.

EXAMPLES

The methods of manufacturing vapor cells may also be described by the following examples. However, examples are for purposes of illustration only. It will be apparent to those skilled in the art that many modifications, both to materials and methods, may be practiced without departing from the scope of the disclosure.

Example 1

A p-type silicon wafer was obtained with a double-sided polish and an <100> orientation. The silicon wafer had a diameter of 4-inches and was 500 μm thick with a surface roughness, $R_a$, no greater than 1 nm on each side. Electrical properties of the silicon wafer included a resistance that ranged from 0.1 Ω-cm to 0.3 Ω-cm. A glass wafer formed of borosilicate glass was also obtained from Schott. The glass wafer was a MEMpax wafer having a diameter of 4 inches and a thickness of 300 μm. The surface roughness was less than 0.5 nm.

The silicon and glass wafers were inspected in preparation for anodic and contact bonding. In particular, the wafers were visually inspected for chips, micro-cracks, and scratches. The wafers were also verified to have a surface roughness less than 1 nm. A 500-nm layer of $SiO_2$ was grown on both sides of the silicon wafer using a wet growth process in an oxidation furnace. The temperature of the oxidation furnace was set to about 1100° C. and the processing time of the silicon wafer was about 40 min. A thickness uniformity of the silicon wafer (with the $SiO_2$ layers) was verified to be within 500±6 nm over its 4-inch diameter area. The surface roughness was also verified to be less than 1 nm.

Multiple silicon chips were cut from the silicon wafer using either a Protolaser U3 micro-laser tool, a Protolaser R micro-laser tool, or a DISCO DAD 3240 dicing saw. Each silicon chip had dimensions of 10 mm×20 mm. Nine holes were subsequently machined through each of the silicon chips using the Protolaser U3 micro-laser tool or the Protolaser R micro-laser tool. The holes were each circular with a 1-mm diameter or square with a 1-mm edge length. In some cases, combinations of circles and holes were machined in a silicon chip. A plurality of holes was also machined around each of the nine holes to create metamaterial walls in the silicon chips. The silicon chips were inspected visually with 5× and 10× magnification loupes for cracks or chips that might have occurred during cutting.

Silicon chips with zero or minimal surface defects were selected for subsequent vapor-cell fabrication.

The selected silicon chips were then cleaned with methanol and isopropanol using cotton swabs and optical tissue paper. Next, the silicon chips were submerged in a buffered oxide etch (BOE) solution having a 10:1 volume ratio and an etch rate of 55 nm/min at room temperature. The buffered oxide etch solution contained hydrofluoric acid buffered with ammonium fluoride. The silicon chips were submerged for at least 11 minutes to remove the 500-nm layer of $SiO_2$ from the surface of each side of the silicon chips. After being removed from the buffered oxide etch, the silicon chips were visually inspected. If embedded material from the cutting process was found on a silicon chip, the silicon chip was discarded. If regions of $SiO_2$ remained on a silicon chip, the silicon chip was re-submerged in the buffered oxide etch solution, removed, and then re-inspected. Silicon chips with both sides free of the 500-nm layer of $SiO_2$ were selected for final cleaning and a 100-nm $SiO_2$ layer was sputtered onto one surface.

The selected silicon chips were then cleaned with acetone and isopropanol using cotton swabs and optical tissue paper. An ultrasonic cleaner was optionally used to assist the cleaning process by agitating baths of acetone or isopropanol in which the selected silicon chips were submerged. A 100-nm layer of $SiO_2$ was then grown on one side of the silicon chips. The temperature of the oxidation furnace was set to a minimum of 600° C. to obtain a surface roughness no greater than 1 nm for the 100-nm layer of $SiO_2$. A thickness uniformity of the 100-nm $SiO_2$ layer was verified to be within 100±6 nm over an area of a silicon chip. Silicon chips failing the uniformity criterion were discarded.

Silicon chips with the 100-nm $SiO_2$ layer were then cleaned with methanol and isopropanol using cotton swabs and optical tissue paper to eliminate loose residues on their surfaces (e.g., such as due to handling). The silicon chips were subsequently deep-cleaned with acetone and isopropanol using cotton swabs and optical tissue paper. A low magnification loupe (e.g., 10×) was used during the deep cleaning process for a first visual inspection followed by a high magnification microscope (e.g., 50×-200×) for a second visual inspection. Silicon chips passing the second vision inspection were placed in a bath of acetone for ultrasonic cleaning at 40 kHz (e.g., in a Branson Ultrasonic Cleaner CPX-952-117R). For example, the silicon chips could be placed in a glass beaker of acetone and cleaned ultrasonically for 20 minutes at room temperature. After ultrasonic cleaning, the silicon chips were dried with particulate-free compressed air and stored in an air-tight container until needed for bonding.

Separately, a dicing saw was used to cut the glass wafers into suitable sizes for bonding to the (stored) silicon chips. Two glass chips were prepared for each silicon chip. If a glass chip was intended for an anodic bond, the glass chip was cut to have the same dimensions as the silicon chip. However, if a glass chip was intended for a contact bond, the glass chip was cut to have longer dimensions than the silicon chip. For example, glass chips for anodic bonding had dimensions of 10 mm×20 mm and glass chips for contact bonding had dimensions of 10 mm×35 mm. After cutting, each glass chip was inspected to ensure that its optical clarity was not degraded (e.g., hazing), or that scratches or cracks were not present. Glass chips found to be acceptable were then cleaned with acetone using cotton swabs and optical tissue paper. If necessary, the glass chips were placed in a glass beaker of acetone and ultrasonically cleaned form 20 minutes at room temperature. After ultrasonic cleaning, the glass chips were dried with particulate-free compressed air and then stored in an air-tight container until needed for bonding.

One silicon chip and one glass chip were then placed into an assembly for anodic bonding. For the silicon chip, the planar surface opposite the planar surface defined by the 100-nm layer of $SiO_2$ participated in the anodic bonding process. In the assembly, planar surfaces of silicon and glass chips were contacted to define an interface, and the interface was visually inspected to confirm that optical fringes were present. The silicon chip was then heated to a temperature of about 400° C. After this temperature was reached, 600V was applied across the silicon and glass chips for about 15 minutes, which drove the formation of an anodic bond. The interface was inspected again to confirm the disappearance of the optical fringes, which indicated the anodic bond was complete. Next, the anodic bond was inspected for defects (e.g., bubbles, micro-cracks, unbonded areas, etc.). If 80% or more of an area around the holes was free of defects, the anodic bond was then further inspected for open channels (e.g., from a hole to the environment, a hole to another hole, etc.). If an open channel was discovered, the anodically-bonded chips were discarded as the anodic bond was not deemed leak-tight.

Bonded silicon and glass chips with leak-tight anodic bonds were cleaned in acetone and methanol. During this cleaning process, the unbonded surface of the silicon chip was cleaned with acetone and methanol using cotton swabs and optical tissue paper to eliminate any residues (e.g., residues from a graphite plate of the assembly used to form the anodic bond). The unbonded surface of the silicon chip was then visually inspected to ensure defects (e.g., scratches, pitting, etc.) were not present that might compromise a soon-to-be formed contact bond. The anodically-bonded chips were then individually cleaned. In particular, the anodically-bonded chips were placed individually (i.e., with no other chips) in a glass beaker of acetone and cleaned ultrasonically for 20 minutes at room temperature. After ultrasonic cleaning, the anodically-bonded chips were dried with particulate-free compressed air. A low magnification loupe (e.g., 10×) was used for a first visual inspection of the anodically-bonded chips, followed by a high magnification microscope (e.g., 50×-200×) for a second visual inspection. The first and second visual inspections were used to ensure no visual residues or deposits remained on the anodically-bonded chips.

The anodically-bonded chips—along with glass chips—were then taken into a clean room environment (e.g., Class 1000 or better) for contact bonding. Single instances of the anodically-bonded chips were paired with single instances of the glass chips to define a pair of chips for contact bonding. For each pair, a planar surface defined by the 100-nm layer of $SiO_2$ on the silicon chip and a planar surface of the glass chip were wiped with optical paper and acetone to clean any macroscopic deposits or contaminants from them. Each pair was then submerged in an acetone bath (e.g., acetone in a beaker) and cleaned via ultrasonic cleaning for 15 minutes. Each pair of chips was subsequently removed from the acetone bath, rinsed with isopropanol (e.g., submerged in an isopropanol bath), and blown dry with dry nitrogen gas.

A pair of chips was placed in a YES-CV200RFS plasma cleaner and cleaned for 45 seconds using a nitrogen plasma. (In some instances, multiple pairs of chips were place in the plasma cleaner.) In particular, the planar surface defined by the 100-nm layer of $SiO_2$ on the silicon chip and the planar surface of the glass chip were activated by plasma cleaning.

The RF-power of the plasma cleaner was set at about 75 W, and the pressure inside was maintained at about 150 mTorr. Nitrogen gas introduced into the plasma cleaner at a volume flow rate of about 20 sccm. After activation by plasma cleaning, the pair of chips was removed from the YES-CV200RFS plasma cleaner and rinsed in de-ionized water for 5 minutes. The rinsing process served to hydroxylate the activated surfaces. In some variations, the rinsing process was conducted with a basic aqueous solution (e.g., an aqueous solution of ammonium hydroxide). Care was taken not to touch the two hydroxylated and activated surfaces together.

The pair of chips was then transferred into a vacuum chamber and mounted into a fixture having a "press finger". The fixture held the glass chip adjacent the silicon chip of the anodically-bonded chip to define a gap. The activated and hydroxylated surface of the glass chip faced the activated and hydroxylated $SiO_2$ surface of the silicon chip. The vacuum chamber was then sealed and pumped down to a reduced pressure (e.g., less than $10^{-3}$ Torr) to remove volatile species (e.g., water vapor) that might react with a vapor of cesium atoms used to fill the cavities of the anodically-bonded chip. The fixture was then chilled to by a thermoelectric cooler, which in turn, chilled at least the anodically-bonded chip to a temperature between $-20°$ C. and $0°$ C.

After the temperatures of the pair of chips stabilized, the vapor of cesium atoms was introduced into the vacuum chamber by opening a valve connecting a source of cesium vapor to the vacuum chamber. The source of the cesium vapor was an oven containing a mass of cesium heated to a processing temperature. A target pressure of cesium vapor in the vacuum chamber could be controlled by altering an opening of the valve, altering the processing temperature induced by the oven, or both. Once the pressure in the vacuum chamber stabilized to the target pressure of cesium vapor, the pair of chips was exposed to the vapor of cesium atoms for a length of time.

The pressure of cesium vapor in the vacuum chamber influences the length of time needed to fill the anodically-bonded chip. One or both of the pressure of cesium vapor in the vacuum chamber and the period of time can be varied to control an amount of cesium vapor that condenses in the cavities of the anodically-bonded chip. Once the length of time had elapsed, the value to the source of cesium vapor was closed. The vacuum chamber was subsequently pumped down to the reduced pressure (e.g., less than $10^{-3}$ Torr) and the power to the thermoelectric cooler turned off.

Once the pair of chips reached ambient temperature, the fixture was actuated to contact the activated and hydroxylated surface of the glass chip to the activated and hydroxylated $SiO_2$ surface of the silicon chip. The "press finger" was used to hold the contacted surfaces together for 20 minutes, which drove the formation of a contact bond. In some variations, the "press finger" was used to apply a target pressure (e.g., about 2 MPa) during the 20-minute duration.

Example 2

A thick glass wafer was obtained from Howard Glass Co., Inc. with a thickness of 1 mm and a diameter of 4 inches. The thick glass wafer had a surface roughness, $R_a$, no greater than 1 nm on each side. Electrical properties of the silicon wafer included a resistance that ranged from 0.1 Ω-cm to 0.3 Ω-cm. A thin glass wafer formed of borosilicate glass was also obtained from Schott. The thin glass wafer was a MEMpax wafer having a diameter of 4 inches and a thickness of 300 μm. The surface roughness was less than 0.5 nm. The thick and thin glass wafers were inspected in preparation for anodic and contact bonding. In particular, the glass wafers were visually inspected for chips, micro-cracks, and scratches. The wafers were also verified to have a surface roughness less than 1 nm.

Next, multiple thick glass chips were cut from the thick glass wafer using either a Protolaser R micro-laser tool or a DISCO DAD 3240 dicing saw. Each thick glass chip had dimensions of 10 mm×20 mm. Nine holes were subsequently machined through each of the thick glass chips with a Protolaser R micro-laser tool. The holes were each circular with a 1-mm diameter or square with a 1-mm edge length. A plurality of holes was also machined around each of the nine holes to create metamaterial walls in the thick glass chips. In some cases, combinations of circles and holes were machined in a thick glass chip. The thick glass chips were inspected visually with 5× and 10× magnification loupes for cracks or chips that might have occurred during cutting. Thick glass chips with zero or minimal surface defects were selected for subsequent vapor-cell fabrication.

The selected thick glass chips were then cleaned with acetone and isopropanol using cotton swabs and optical tissue paper. An ultrasonic cleaner was optionally used to assist the cleaning process by agitating baths of acetone or isopropanol in which the selected thick glass chips were submerged. A less than 1 μm layer of Si (e.g., a 150 nm layer of Si) was then grown on one side of the thick glass chips using plasma-enhanced chemical vapor deposition (PECVD). A thickness uniformity of the Si layer was verified to be within ±6 nm over an area of a thick glass chip. Thick glass chips failing the uniformity criterion were discarded.

The thick glass chips were then cleaned with methanol and isopropanol using cotton swabs and optical tissue paper to eliminate loose residues on their surfaces (e.g., such as due to handling). The thick glass chips were subsequently deep-cleaned with acetone and isopropanol using cotton swabs and optical tissue paper. A low magnification loupe (e.g., 10×) was used during the deep cleaning process for a first visual inspection followed by a high magnification microscope (e.g., 50×-200×) for a second visual inspection. Thick glass chips passing the second vision inspection were placed in a bath of acetone for ultrasonic cleaning at 40 kHz (e.g., in a Branson Ultrasonic Cleaner CPX-952-117R). For example, the thick glass chips could be placed in a glass beaker of acetone and cleaned ultrasonically for 20 minutes at room temperature. After ultrasonic cleaning, the thick glass chips were dried with particulate-free compressed air and stored in an air-tight container until needed for bonding.

Separately, a dicing saw was used to cut the thin glass wafers into suitable sizes for bonding to the (stored) thick glass chips. Two thin glass chips were prepared for each thick glass chip. If a thin glass chip was intended for an anodic bond, the thin glass chip was cut to have the same dimensions as the thick glass chip. However, if a thin glass chip was intended for a contact bond, the thin glass chip was cut to have longer dimensions than the thick glass chip. For example, thin glass chips for anodic bonding had dimensions of 10 mm×20 mm and thin glass chips for contact bonding had dimensions of 10 mm×35 mm. After cutting, each thin glass chip was inspected to ensure that its optical clarity was not degraded (e.g., hazing), or that scratches or cracks were not present. Then glass chips found to be acceptable were then cleaned with acetone using cotton swabs and optical tissue paper. If necessary, the thin glass chips were placed in a glass beaker of acetone and ultrasonically cleaned form 20 minutes at room temperature. After ultrasonic cleaning, the glass chips were dried with particulate-free compressed air and then stored in an airtight container until needed for bonding.

One thick glass chip (with a layer of Si up to 1 μm thick) and one thin glass chip were then placed into an assembly for anodic bonding. For the thick glass chip, the planar surface defined by the up to 1 μm layer of Si participated in the anodic bonding process. In the assembly, planar surfaces of the thick and thin glass chips were contacted to define an interface, and the interface was visually inspected to confirm that optical fringes were present. The thick glass chip was then heated to a temperature of about 400° C. After this temperature was reached, 600V was applied across the thick and thin glass chips for about 15 minutes, which drove the formation of an anodic bond. The interface was inspected again to confirm the disappearance of the optical fringes, which indicated the anodic bond was complete. Next, the anodic bond was inspected for defects (e.g., bubbles, microcracks, unbonded areas, etc.). If 80% or more of an area around the holes was free of defects, the anodic bond was then further inspected for open channels (e.g., from a hole to the environment, a hole to another hole, etc.). If an open channel was discovered, the anodically-bonded chips were discarded as the anodic bond was not deemed leak-tight.

Bonded thick and thin glass chips with leak-tight anodic bonds were cleaned in acetone and methanol. During this cleaning process, the unbonded surface of the thick glass chip was cleaned with acetone and methanol using cotton swabs and optical tissue paper to eliminate any residues (e.g., residues from a graphite plate of the assembly used to form the anodic bond). The unbonded surface of the thick glass chip was then visually inspected to ensure defects (e.g., scratches, pitting, etc.) were not present that might compromise a soon-to-be formed contact bond. The anodically-bonded chips were then individually cleaned. In particular, the anodically-bonded chips were placed individually (i.e., with no other chips) in a glass beaker of acetone and cleaned ultrasonically for 20 minutes at room temperature. After ultrasonic cleaning, the anodically-bonded chips were dried with particulate-free compressed air. A low magnification loupe (e.g., 10×) was used for a first visual inspection of the anodically-bonded chips, followed by a high magnification microscope (e.g., 50×-200×) for a second visual inspection. The first and second visual inspections were used to ensure no visual residues or deposits remained on the anodically-bonded chips.

The anodically-bonded chips—along with unbonded thin glass chips—were then taken into a clean room environment (e.g., Class 1000 or better) for contact bonding. Single instances of anodically-bonded chips were paired with single instances of thin glass chips to define a pair for contact bonding. For each pair, an unbonded planar surface of the thick glass chip (i.e., without the layer of Si up to 1 μm) and a planar surface of the thin glass chip were wiped with optical paper and acetone to clean any macroscopic deposits or contaminants from them. Each pair was then submerged in an acetone bath (e.g., acetone in a beaker) and cleaned via ultrasonic cleaning for 15 minutes. Each pair of chips was subsequently removed from the acetone bath, rinsed with isopropanol (e.g., submerged in an isopropanol bath), and blown dry with dry nitrogen gas.

A pair of chips was placed in a YES-CV200RFS plasma cleaner and cleaned for 45 seconds using a nitrogen plasma. (In some instances, multiple pairs of chips were place in the plasma cleaner.) In particular, the unbonded planar surface of the thick glass chip and the planar surface of the glass chip were activated by plasma cleaning. The RF-power of the plasma cleaner was set at about 75 W, and the pressure inside was maintained at about 150 mTorr. Nitrogen gas introduced into the plasma cleaner at a volume flow rate of about 20 sccm. After activation by plasma cleaning, the pair of chips was removed from the YES-CV200RFS plasma cleaner and rinsed in de-ionized water for 5 minutes. The rinsing process served to hydroxylate the activated surfaces. In some variations, the rinsing process was conducted with a basic aqueous solution (e.g., an aqueous solution of ammonium hydroxide). Care was taken not to touch the two hydroxylated and activated surfaces together.

The pair of chips was then transferred into a vacuum chamber and mounted into a fixture having a "press finger". The fixture held the thin glass chip adjacent the thick glass chip of the anodically-bonded chip to define a gap. The activated and hydroxylated surface of the thin glass chip faced the activated and hydroxylated unbonded surface of the thick glass chip. The vacuum chamber was then sealed and pumped down to a reduced pressure (e.g., less than $10^{-3}$ Torr) to remove volatile species (e.g., water vapor) that might react with a vapor of cesium atoms used to fill the cavities of the anodically-bonded chip. The fixture was then chilled to by a thermoelectric cooler, which in turn, chilled at least the anodically-bonded chip to a temperature between −20° C. and 0° C.

After the temperatures of the pair of chips stabilized, the vapor of cesium atoms was introduced into the vacuum chamber by opening a valve connecting a source of cesium vapor to the vacuum chamber. The source of the cesium vapor was an oven containing a mass of cesium heated to a processing temperature. A target pressure of cesium vapor in the vacuum chamber could be controlled by altering an opening of the valve, altering the processing temperature induced by the oven, or both. Once the pressure in the vacuum chamber stabilized to the target pressure of cesium vapor, the pair of chips was exposed to the vapor of cesium atoms for a length of time.

The pressure of cesium vapor in the vacuum chamber influences the length of time needed to fill the anodically-bonded chip. One or both of the pressure of cesium vapor in the vacuum chamber and the length of time can be varied to control an amount of cesium vapor that condenses in the cavities of the anodically-bonded chip. Once the length of time had elapsed, the value to the source of cesium vapor was closed. The vacuum chamber was subsequently pumped down to the reduced pressure (e.g., less than $10^{-3}$ Torr) and the power to the thermoelectric cooler turned off.

Once the pair of chips reached ambient temperature, the fixture was actuated to contact the activated and hydroxylated surface of the glass chip to the activated and hydroxylated unbonded surface of the thick glass chip. The "press finger" was used to hold the contacted surfaces together for 20 minutes, which drove the formation of a contact bond. In some variations, the "press finger" was used to apply a target pressure (e.g., about 2 MPa) during the 20-minute duration.

In some aspects of what is described, a method of manufacturing a vapor cell may additionally be described by the following examples:

Example 1

A method of manufacturing a vapor cell, the method comprising:
 obtaining a dielectric body comprising:
  a surface that defines an opening to a cavity in the dielectric body, and a plurality of holes between the cavity and a side of the dielectric body;

obtaining an optical window that comprises a surface;

disposing a vapor or a source of the vapor into the cavity; and bonding the surface of the optical window to the surface of the dielectric body to form a seal around the opening to the cavity.

Example 2

The method of example 1, wherein bonding the surface comprises covering the opening of the cavity with the optical window to enclose the vapor or the source of the vapor in the cavity.

Example 3

The method of example 1 or example 2, wherein the plurality of holes encircles a perimeter defined by the opening of the cavity.

Example 4

The method of example 3, wherein the plurality of holes comprises a pattern of holes repeating around the perimeter.

Example 5

The method of example 1 or any one of examples 2-4,
wherein the surface of the dielectric body is a first surface and the dielectric body comprises a second surface opposite the first surface; and
wherein the plurality of holes extends from the first surface to the second surface.

Example 6

The method of example 1 or any one of examples 2-5, wherein the surface of the dielectric body and the surface of the optical window are planar surfaces.

Example 7

The method of example 1 or any one of examples 2-6,
wherein the vapor cell, when manufactured, is configured to detect a target radiation; and
wherein each of the plurality of holes has a largest dimension no greater than a wavelength of the target radiation.

Example 8

The method of example 7, wherein the target radiation has a wavelength of at least 0.3 mm.

Example 9

The method of example 1 or any one of examples 2-8, wherein the dielectric body is formed of silicon.

Example 10

The method of example 9, comprising:
forming an adhesion layer on the dielectric body that defines the surface of the dielectric body, the adhesion layer comprising silicon oxide.

Example 11

The method of example 1 or any one of examples 2-8, wherein the dielectric body is formed of a glass comprising silicon oxide.

Example 12

The method of example 1 or any one of examples 2-11, wherein the optical window comprises silicon oxide.

Example 13

The method of example 1 or any one of examples 2-12, wherein disposing the vapor or the source of the vapor comprises exposing the cavity to a vacuum environment comprising a gas of alkali-metal atoms.

Example 14

The method of example 1 or any one of examples 2-13, comprising:
altering the surface of the dielectric body and the surface of the optical window to comprise, respectively, a first plurality of hydroxyl ligands and a second plurality of hydroxyl ligands;
wherein bonding the surfaces comprises contacting the altered surface of the dielectric body to the altered surface of the optical window to form the seal around the opening of the cavity, the seal comprising metal-oxygen bonds formed by reacting the first plurality of hydroxyl ligands with the second plurality of hydroxyl ligands during contact of the altered surfaces.

Example 15

The method of example 14, wherein altering the surfaces comprises activating one or both of the surfaces of the dielectric body and the optical window by exposing the respective surfaces to a plasma.

Example 16

The method of example 15, wherein altering the surfaces comprises washing one or both of the activated surfaces of the dielectric body and the optical window in a basic aqueous solution.

Example 17

The method of example 1 or any one of examples 2-16, wherein obtaining the dielectric body comprises removing material from the dielectric body to form the cavity, the plurality of holes, or both.

Example 18

The method of example 17, wherein removing material comprises etching material from the surface of the dielectric body.

Example 19

The method of example 17, wherein removing material comprises machining material from the surface of the dielectric body with a laser.

Example 20

The method of example 1 or any one of examples 2-19,
wherein the surface is a first surface, the opening is a first opening, the optical window is a first optical window, and the seal is a first seal;
wherein the dielectric body comprises a second surface that defines a second opening to the cavity of the dielectric body; and
wherein the method comprises:
obtaining a second optical window that comprises a surface, and
bonding the surface of the second optical window to the second surface of the dielectric body to form a second seal around the second opening of the cavity.

Example 21

The method of example 20,
wherein the plurality of holes is a first plurality of holes extending from the first surface into the dielectric body, the first plurality of holes between the first opening of the cavity and the side of the dielectric body; and
wherein the dielectric body comprises a second plurality of holes extending from the second surface into the dielectric body, the second plurality of holes between the second opening of the cavity and the side of the dielectric body.

Example 22

The method of example 21, wherein the second plurality of holes encircles a second perimeter defined by the second opening of the cavity.

Example 23

The method of example 22, wherein the second plurality of holes comprises a pattern of holes repeating around the second perimeter.

Example 24

The method of example 20 or any one of examples 21-23, wherein the second surface of the dielectric body and the surface of the second optical window are planar surfaces.

Example 25

The method of example 24, wherein the first and second surfaces of the dielectric body are opposite each other.

Example 26

The method of example 20 or any one of examples 21-25 (excluding the subject matter of example 11 in any combination of examples that includes example 26),
wherein the dielectric body is formed of silicon and the second optical window comprises silicon oxide; and
wherein bonding the surface of the second optical window comprises anodically bonding the surface of the second optical window to the second surface of the dielectric body to form the second seal.

Example 27

The method of example 20 or any one of examples 21-25 (excluding the subject matter of examples 9-10 in any combination of examples that includes example 27),
wherein the dielectric body is formed of a glass comprising silicon oxide and the second optical window comprises silicon oxide;
wherein the method comprises depositing a layer of silicon on the second surface of the dielectric body; and
wherein bonding the surface of the second optical window comprises anodically bonding the layer of silicon to the surface of the second optical window to form the second seal.

Example 28

The method of example 20 or any one of examples 21-25 (excluding the subject matter of examples 9-10 in any combination of examples that includes example 28),
wherein the dielectric body is formed of a glass comprising silicon oxide and the second optical window comprises silicon oxide; and
wherein bonding the surface of the second optical window comprises:
applying a glass frit to one or both of the second surface of the dielectric body and the surface of the second optical window,
contacting the second surface of the dielectric body to the surface of the second optical window, and
heating at least one of the glass frit, the dielectric body, or the second optical window to a firing temperature to form the second seal.

Example 29

The method of example 20 or any one of examples 21-25, altering the second surface of the dielectric body and the surface of the second optical window to comprise, respectively, a third plurality of hydroxyl ligands and a fourth plurality of hydroxyl ligands;
wherein bonding the surfaces comprises contacting the altered second surface of the dielectric body to the altered surface of the second optical window to form the second seal around the second opening of the cavity, the second seal comprising metal-oxygen bonds formed by reacting the third plurality of hydroxyl ligands with the fourth plurality of hydroxyl ligands during contact of the altered surfaces.

In some aspects of what is described, a vapor cell may be also be described by the following examples:

Example 30

A vapor cell, comprising:
a dielectric body comprising:
a surface that defines an opening to a cavity in the dielectric body, and
a plurality of holes between the cavity and a side of the dielectric body;
a vapor or a source of the vapor in the cavity of the dielectric body; and
an optical window covering the opening of the cavity and having a surface bonded to the surface of the dielectric body to form a seal around the opening.

Example 31

The vapor cell of example 30, wherein the plurality of holes encircles a perimeter defined by the opening of the cavity.

Example 32

The vapor cell of example 31, wherein the plurality of holes comprises a pattern of holes repeating around the perimeter.

Example 33

The vapor cell of example 30 or any one of examples 31-32,
wherein the surface of the dielectric body is a first surface and the dielectric body comprises a second surface opposite the first surface; and
wherein the plurality of holes extends from the first surface to the second surface.

Example 34

The vapor cell of example 30 or any one of examples 31-33, wherein the surface of the dielectric body and the surface of the optical window are planar surfaces.

Example 35

The vapor cell of example 30 or any one of examples 31-34, wherein the vapor comprises a gas of alkali-metal atoms.

Example 36

The vapor cell of example 30 or any one of examples 31-35, wherein the vapor cell is configured to detect a target radiation; and wherein each of the plurality of holes has a largest dimension no greater than a wavelength of the target radiation.

Example 37

The vapor cell of example 36, wherein the target radiation has a wavelength of at least 0.3 mm.

Example 38

The vapor cell of example 30 or any one of examples 31-37, wherein the seal comprises metal-oxygen bonds formed by reacting a first plurality of hydroxyl ligands on the surface of the dielectric body with a second plurality of hydroxyl ligands on the surface of the optical window.

Example 39

The vapor cell of example 30 or any one of examples 31-38, wherein the dielectric body is formed of silicon.

Example 40

The vapor cell of example 39, wherein the vapor cell comprises an adhesion layer on the dielectric body that defines the surface of the dielectric body, the adhesion layer comprising silicon oxide.

Example 41

The vapor cell of example 30 or any one of examples 31-38, wherein the dielectric body is formed of a glass comprising silicon oxide.

Example 42

The vapor cell of example 30 or any one of examples 31-41, wherein the optical window comprises silicon oxide.

Example 43

The vapor cell of example 30 or any one of examples 31-42,
wherein the surface of the dielectric body is a first surface of the dielectric body, the opening is a first opening, the optical window is a first optical window, and the seal is a first seal;
wherein the dielectric body comprises a second surface that defines a second opening to the cavity of the dielectric body; and
wherein the vapor cell comprises a second optical window covering the second opening of the cavity and having a surface bonded to the second surface of the dielectric body to form a second seal around the second opening.

Example 44

The vapor cell of example 43,
wherein the plurality of holes is a first plurality of holes extending from the first surface into the dielectric body, the first plurality of holes between the first opening of the cavity and the side of the dielectric body; and
wherein the dielectric body comprises a second plurality of holes extending from the second surface into the dielectric body, the second plurality of holes between the second opening of the cavity and the side of the dielectric body.

Example 45

The vapor cell of example 44, wherein the second plurality of holes encircles a second perimeter defined by the second opening of the cavity.

Example 46

The vapor cell of example 45, wherein the second plurality of holes comprises a pattern of holes repeating around the second perimeter.

Example 47

The vapor cell of example 43 or any one of examples 44-46, wherein the second surface of the dielectric body and the surface of the second optical window are planar surfaces.

Example 48

The vapor cell of example 47, wherein the first and second surfaces of the dielectric body are opposite each other.

Example 49

The vapor cell of example 43 or any one of examples 44-48 (excluding the subject matter of example 41 in any combination of examples that includes example 49),
wherein the dielectric body is formed of silicon and the second optical window comprises silicon oxide; and
wherein the second seal comprises an anodic bond between the second surface of the dielectric body and the surface of the second optical window.

Example 50

The vapor cell of example 43 or any one of examples 44-48 (excluding the subject matter of examples 39-40 in any combination of examples that includes example 50),
wherein the dielectric body is formed of a glass comprising silicon oxide and the second optical window comprises silicon oxide;
wherein the vapor cell comprises a layer of silicon disposed between the second surface of the dielectric body and the surface of the second optical window; and
wherein the second seal comprises an anodic bond between the layer of silicon and one or both of the second surface of the dielectric body and the surface of the second optical window.

Example 51

The vapor cell of example 43 or any one of examples 44-48 (excluding the subject matter of examples 39-40 in any combination of examples that includes example 51),
wherein the dielectric body is formed of a glass comprising silicon oxide and the second optical window comprises silicon oxide; and
wherein the vapor cell comprises a fired layer of glass frit bonding the second surface of the dielectric body to the surface of the second optical window, the fired layer of glass frit defining the second seal.

Example 52

The vapor cell of example 43 or any one of examples 44-48, wherein the second seal comprises metal-oxygen bonds formed by reacting a third plurality of hydroxyl ligands on the second surface of the dielectric body with a fourth plurality of hydroxyl ligands on the surface of the second optical window.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A method of manufacturing a vapor cell, the method comprising:
    obtaining a dielectric body comprising:
        a surface that defines an opening to a cavity in the dielectric body, and
        a plurality of holes between the cavity and a side of the dielectric body;
    obtaining an optical window that comprises a surface;
    disposing a vapor or a source of the vapor into the cavity; and
    bonding the surface of the optical window to the surface of the dielectric body to form a seal around the opening to the cavity.

2. The method of claim 1, wherein bonding the surface comprises covering the opening of the cavity with the optical window to enclose the vapor or the source of the vapor in the cavity.

3. The method of claim 1, wherein the plurality of holes encircles a perimeter defined by the opening of the cavity.

4. The method of claim 3, wherein the plurality of holes comprises a pattern of holes repeating around the perimeter.

5. The method of claim 1, wherein the surface of the dielectric body and the surface of the optical window are planar surfaces.

6. The method of claim 1,
    wherein the vapor cell, when manufactured, is configured to detect a target radiation; and
    wherein each of the plurality of holes has a largest dimension no greater than a wavelength of the target radiation.

7. The method of claim 6, wherein the target radiation has a wavelength of at least 0.3 mm.

8. The method of claim 1, wherein the dielectric body is formed of silicon.

9. The method of claim 8, comprising:
    forming an adhesion layer on the dielectric body that defines the surface of the dielectric body, the adhesion layer comprising silicon oxide.

10. The method of claim 1, wherein the dielectric body is formed of a glass comprising silicon oxide.

11. The method of claim 1, wherein the optical window comprises silicon oxide.

12. The method of claim 1, wherein disposing the vapor or the source of the vapor comprises exposing the cavity to a vacuum environment comprising a gas of alkali-metal atoms.

13. The method of claim 1, wherein obtaining the dielectric body comprises removing material from the dielectric body to form the cavity, the plurality of holes, or both.

14. The method of claim 1,
    wherein the surface is a first surface, the opening is a first opening, the optical window is a first optical window, and the seal is a first seal;
    wherein the dielectric body comprises a second surface that defines a second opening to the cavity of the dielectric body; and
    wherein the method comprises:
        obtaining a second optical window that comprises a surface, and
        bonding the surface of the second optical window to the second surface of the dielectric body to form a second seal around the second opening of the cavity.

15. The method of claim 14,
    wherein the plurality of holes is a first plurality of holes extending from the first surface into the dielectric body, the first plurality of holes between the first opening of the cavity and the side of the dielectric body; and
    wherein the dielectric body comprises a second plurality of holes extending from the second surface into the dielectric body, the second plurality of holes between the second opening of the cavity and the side of the dielectric body.

16. The method of claim 15, wherein the second plurality of holes encircles a second perimeter defined by the second opening of the cavity.

17. The method of claim 16, wherein the second plurality of holes comprises a pattern of holes repeating around the second perimeter.

18. A vapor cell, comprising:
a dielectric body comprising:
a surface that defines an opening to a cavity in the dielectric body, and
a plurality of holes between the cavity and a side of the dielectric body;
a vapor or a source of the vapor in the cavity of the dielectric body; and
an optical window covering the opening of the cavity and having a surface bonded to the surface of the dielectric body to form a seal around the opening.

19. The vapor cell of claim 18, wherein the plurality of holes encircles a perimeter defined by the opening of the cavity.

20. The vapor cell of claim 19, wherein the plurality of holes comprises a pattern of holes repeating around the perimeter.

21. The vapor cell of claim 18,
wherein the vapor cell is configured to detect a target radiation; and
wherein each of the plurality of holes has a largest dimension no greater than a wavelength of the target radiation.

22. The vapor cell of claim 21, wherein the target radiation has a wavelength of at least 0.3 mm.

23. The vapor cell of claim 18, wherein the dielectric body is formed of silicon.

24. The vapor cell of claim 23, wherein the vapor cell comprises an adhesion layer on the dielectric body that defines the surface of the dielectric body, the adhesion layer comprising silicon oxide.

25. The vapor cell of claim 18, wherein the dielectric body is formed of a glass comprising silicon oxide.

26. The vapor cell of claim 18, wherein the optical window comprises silicon oxide.

27. The vapor cell of claim 18,
wherein the surface of the dielectric body is a first surface of the dielectric body, the opening is a first opening, the optical window is a first optical window, and the seal is a first seal;
wherein the dielectric body comprises a second surface that defines a second opening to the cavity of the dielectric body; and
wherein the vapor cell comprises a second optical window covering the second opening of the cavity and having a surface bonded to the second surface of the dielectric body to form a second seal around the second opening.

28. The vapor cell of claim 27,
wherein the plurality of holes is a first plurality of holes extending from the first surface into the dielectric body, the first plurality of holes between the first opening of the cavity and the side of the dielectric body; and
wherein the dielectric body comprises a second plurality of holes extending from the second surface into the dielectric body, the second plurality of holes between the second opening of the cavity and the side of the dielectric body.

29. The vapor cell of claim 28, wherein the second plurality of holes encircles a second perimeter defined by the second opening of the cavity.

30. The vapor cell of claim 29, wherein the second plurality of holes comprises a pattern of holes repeating around the second perimeter.

* * * * *